United States Patent
Ohta et al.

(10) Patent No.: US 7,041,429 B2
(45) Date of Patent: May 9, 2006

(54) LIGHT SENSITIVE COMPOSITION AND LIGHT SENSITIVE PLANOGRAPHIC PRINTING PLATE MATERIAL

(75) Inventors: Tomohisa Ohta, Hino (JP); Takaaki Kuroki, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 35 days.

(21) Appl. No.: 10/769,389

(22) Filed: Jan. 30, 2004

(65) Prior Publication Data

US 2004/0191691 A1 Sep. 30, 2004

(30) Foreign Application Priority Data

Feb. 7, 2003 (JP) ............................. 2003-030685
Oct. 31, 2003 (JP) ............................. 2003-371878

(51) Int. Cl.
*G03F 7/04* (2006.01)

(52) U.S. Cl. ................ 430/270.1; 430/302; 430/913

(58) Field of Classification Search ............ 430/270.1, 430/302, 913

See application file for complete search history.

(56) References Cited

U.S. PATENT DOCUMENTS

| | | | |
|---|---|---|---|
| 5,049,479 A | 9/1991 | Zertani et al. | |
| 5,085,974 A | 2/1992 | Frass et al. | |

FOREIGN PATENT DOCUMENTS

| | | | |
|---|---|---|---|
| EP | 0 700 909 A1 | | 3/1996 |
| JP | 2001-66773 | | 3/2001 |
| JP | 2002202595 A | * | 7/2002 |
| JP | 2002202596 A | * | 7/2002 |
| JP | 2002-221798 | | 8/2002 |
| JP | 2002221798 A | * | 8/2002 |

OTHER PUBLICATIONS

ENglsih language machine translation of JP 202-202595.*

* cited by examiner

*Primary Examiner*—Amanda Walke
(74) *Attorney, Agent, or Firm*—Lucas & Mercanti

(57) ABSTRACT

Disclosed are a light sensitive composition comprising an addition polymerizable ethylenically unsaturated monomer, a photopolymerization initiator and a polymer binder, and a light sensitive planographic printing plate material comprising a hydrophilic support, and provided thereon, the light sensitive composition, wherein the photopolymerization initiator is a trihalomethyl group-containing oxadiazole compound represented by the following formula 1 or 2,

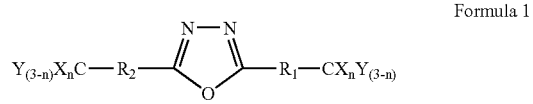

Formula 1

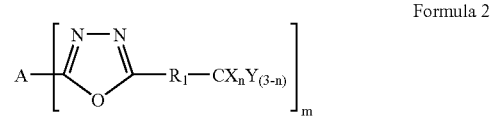

Formula 2

20 Claims, No Drawings

LIGHT SENSITIVE COMPOSITION AND LIGHT SENSITIVE PLANOGRAPHIC PRINTING PLATE MATERIAL

FIELD OF THE INVENTION

The present invention relates to a light sensitive composition comprised of an addition polymerizable ethylenically unsaturated monomer, a photopolymerization initiator and a polymer binder, and a light sensitive planographic printing plate material comprising a hydrophilic support, and coated thereon, the light sensitive composition.

BACKGROUND OF THE INVENTION

A printing plate material for CTP capable of recording digital data employing a laser beam is required to be more highly light-sensitive for the purpose of carrying out recording in a short time. Further, a printing plate having high printing durability has been desired in various printing fields such as newspaper printing and commercial printing.

In order to obtain high sensitivity, an attempt to employ a photo-radical polymerization has been made, and a method employing, as a photopolymerization initiator, a trichloromethyl group-containing s-triazine compound has been proposed in Japanese Patent O.P.I. Publication Nos. 48-36281, 54-74887, and 64-35548. However, this method results in poor sensitivity.

A method employing, as a photopolymerization initiator, a combination of an iron-arene complex and a peroxide has been proposed in Japanese Patent O.P.I. Publication No. 59-219307, a method employing, as a photopolymerization initiator, a monoalkyltriaryl borate compound in Japanese Patent O.P.I. Publication Nos. 62-150242, 62-143044, and 64-35548, and a method employing, as a photopolymerization initiator, a titanocene compound in Japanese Patent O.P.I. Publication Nos. 63-41483 and 2-291. However, these methods also result in poor sensitivity.

Further, a method employing a combination of a monomer (an addition polymerizable ethylenically unsaturated monomer) having a tertiary amine and a trihalogenomethyl group-containing s-triazine compound has been proposed in Japanese Patent O.P.I. Publication No. 1-105238, and a method employing a combination of a monomer (an addition polymerizable ethylenically unsaturated monomer) having a tertiary amine, a trihalogenomethyl group-containing s-triazine compound and a metallocene compound such as titanocene has been proposed in Japanese Patent O.P.I. Publication No. 2-127404. These methods exhibit improved sensitivity, but poor printing durability.

Proposal employing a combination of titanocene and an oxadiazole compound having one halogenomethyl group has been made (see Japanese Patent O.P.I. Publication Nos. 2001-66773), however, this method has problem in that sensitivity and storage stability are poor.

SUMMARY OF THE INVENTION

An object of the invention is to provide a light sensitive planographic printing plate material comprising a light sensitive composition giving excellent small dot reproduction, excellent storage stability, reduced sludge on development as well as high sensitivity and high printing durability.

DETAILED DESCRIPTION OF THE INVENTION

The above objects of the invention can be attained by the followings:

1. A light sensitive composition comprising an addition polymerizable ethylenically unsaturated monomer, a photopolymerization initiator, and a polymer binder, wherein the photopolymerization initiator is a trihalomethyl group-containing oxadiazole compound represented by the following formula 1,

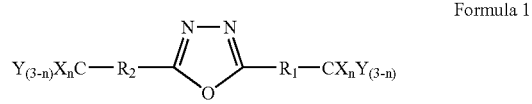

Formula 1 wherein $R_1$ and $R_2$ independently represent a chemical bond, or a divalent group selected from a substituted or unsubstituted alkylene group, a substituted or unsubstituted alkyleneoxy group, an ether group, a carbonyl group, an ester group, a carbonylamino group or a sulfonylamino group, provided that $R_1$ and $R_2$ may be the same or different; X represents a chlorine atom or a bromine atom; Y represents a hydrogen atom or a substituted or unsubstituted alkyl group with a carbon atom number of from 1 to 8; and n is 2 or 3.

2. The light sensitive composition of item 1 above, wherein the addition polymerizable ethylenically unsaturated monomer has a tertiary amino group in the molecule.

3. The light sensitive composition of item 1 above, wherein the addition polymerizable ethylenically unsaturated monomer is a reaction product of a polyhydric alcohol having a tertiary amino group in the molecule, a diisocyanate compound, and a compound having in the molecule a hydroxyl group and an addition polymerizable ethylenic double bond.

4. The light sensitive composition of item 1 above, further comprising a titanocene compound as a photopolymerization initiator.

5. The light sensitive composition of item 1 above, further comprising a monoalkyltriaryl-borate compound as a photopolymerization initiator.

6. The light sensitive composition of item 1 above, further comprising an iron-arene compound as a photopolymerization initiator.

7. The light sensitive composition of item 1 above, further comprising a dye having an absorption maximum in the wavelength regions of from 350 to 1200 nm.

8. The light sensitive composition of item 7 above, wherein the absorption maximum is in the wavelength regions of from 390 to 430 nm.

9. The light sensitive composition of item 1 above, further comprising a light-to-heat conversion material.

10. A light sensitive composition comprising an addition polymerizable ethylenically unsaturated monomer, a photopolymerization initiator, and a polymer binder, wherein the photopolymerization initiator is at least one trihalomethyl group-containing oxadiazole compound represented by the following formula 2,

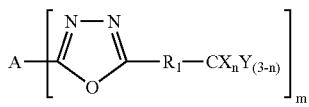

Formula 2 wherein $R_1$ represents a chemical bond, or a divalent group selected from a substituted or unsubstituted alkylene group, a substituted or unsubstituted alkyleneoxy group, an ether group, a carbonyl group, an ester group, a carbonylamino group or a sulfonylamino group; X represents a chlorine atom or a bromine atom; Y represents a hydrogen atom or a substituted or unsubstituted alkyl group with a carbon atom number of from 1 to 8; n is 2 or 3; m is an integer of not less than 2; and A represents an m-valent organic group.

11. The light sensitive composition of item 10 above, wherein m is an integer of from 2 to 8, and A represents a polyvalent aliphatic group, a polyvalent aromatic group, —O—, —S—, —$NHSO_2$—, —NHCO—, —NH— or a combination thereof.

12. The light sensitive composition of item 10 above, wherein the addition polymerizable ethylenically unsaturated monomer has a tertiary amino group in the molecule.

13. The light sensitive composition of item 10 above, wherein the addition polymerizable ethylenically unsaturated monomer is a reaction product of a polyhydric alcohol having a tertiary amino group in the molecule, a diisocyanate compound, and a compound having in the molecule a hydroxyl group and an addition polymerizable ethylenic double bond.

14. The light sensitive composition of item 10 above, further comprising a titanocene compound as a photopolymerization initiator.

15. The light sensitive composition of item 10 above, further comprising a monoalkyltriaryl-borate compound as a photopolymerization initiator.

16. The light sensitive composition of item 10 above, further comprising an iron-arene compound as a photopolymerization initiator.

17. The light sensitive composition of item 10 above, further comprising a dye having an absorption maximum in the wavelength regions of from 350 to 1200 nm.

18. The light sensitive composition of item 17 above, wherein the absorption maximum is in the wavelength regions of from 390 to 430 nm.

19. The light sensitive composition of item 10 above, further comprising a light-to-heat conversion material.

20. A light sensitive planographic printing plate material comprising a hydrophilic support, and provided thereon, the light sensitive composition of item 1 above.

21. A light sensitive planographic printing plate material comprising a hydrophilic support, and provided thereon, the light sensitive composition of item 10 above.

1-1. A light sensitive composition comprising an addition polymerizable ethylenically unsaturated monomer, a photopolymerization initiator composition, and a polymer binder, wherein the photopolymerization initiator composition includes at least one selected from trihalomethyl group-containing oxadiazole compounds represented by formula 1 above.

1-2. The light sensitive composition of item 1-1 above, wherein the addition polymerizable ethylenically unsaturated monomer has a tertiary amino group in the molecule.

1-3. The light sensitive composition of item 1-1 above, wherein the addition polymerizable ethylenically unsaturated monomer is a reaction product of a polyhydric alcohol having a tertiary amino group in the molecule, a diisocyanate compound, and a compound having in the molecule a hydroxyl group and an addition polymerizable ethylenic double bond.

1-4. The light sensitive composition of any one of items 1-1 through 1-3 above, wherein the photopolymerization initiator composition includes a titanocene compound.

1-5. The light sensitive composition of any one of items 1-1 through 1-3 above, wherein the photopolymerization initiator composition includes a monoalkyltriarylborate compound.

1-6. The light sensitive composition of any one of items 1-1 through 1-3 above, wherein the photopolymerization initiator composition includes an iron-arene compound.

1-7. A light sensitive planographic printing plate material comprising a hydrophilic support, and provided thereon, the light sensitive composition of any one of items 1-1 through 1-6 above.

1-8. The light sensitive planographic printing plate material of item 1-7 above, comprising a hydrophilic support, and coated thereon, a light sensitive composition comprised of an addition polymerizable ethylenically unsaturated monomer, a photopolymerization initiator composition, a polymer binder, and an organic solvent, wherein the photopolymerization initiator composition includes at least one trihalomethyl group-containing oxadiazole compound represented by formula 1 above, and a dye having an absorption maximum in the wavelength regions of from 390 to 430 nm.

2-1. A light sensitive composition comprising an addition polymerizable ethylenically unsaturated monomer, a photopolymerization initiator, and a polymer binder, wherein the photopolymerization initiator is at least one selected from trihalomethyl group-containing oxadiazole compounds represented by formula 1 above.

2-2. A light sensitive composition comprising an addition polymerizable ethylenically unsaturated monomer, a photopolymerization initiator, and a polymer binder, wherein the photopolymerization initiator is at least one selected from trihalomethyl group-containing oxadiazole compounds represented by formula 2 above.

2-3 The light sensitive composition of item 2-1 or 2-2 above, wherein the addition polymerizable ethylenically unsaturated monomer has a tertiary amino group in the molecule.

2-4. The light sensitive composition of item 2-1 or 2-2 above, wherein the addition polymerizable ethylenically unsaturated monomer is a reaction product of a polyhydric alcohol having a tertiary amino group in the molecule, a diisocyanate compound, and a compound having in the molecule a hydroxyl group and an addition polymerizable ethylenic double bond.

2-5. The light sensitive composition of any one of items 2-1 through 2-4 above, further comprising a titanocene compound as the photopolymerization initiator.

2-6. The light sensitive composition of any one of items 2-1 through 2-4 above, further comprising a monoalkyltriaryl-borate compound as the photopolymerization initiator.

2-7. The light sensitive composition of any one of items 2-1 through 2-4 above, further comprising an iron-arene compound as the photopolymerization initiator.

2-8. The light sensitive composition of any one of items 2-1 through 2-7 above, further comprising a dye having an absorption maximum in the wavelength regions of from 350 to 1200 nm.

2-9. The light sensitive composition of item 2-8 above, wherein the dye has an absorption maximum in the wavelength regions of from 390 to 430 nm.

2-10. A light sensitive planographic printing plate material comprising a hydrophilic support, and provided thereon, the light sensitive composition of any one of items 2-1 through 2-9 above.

The invention will be detailed below.

The present invention is a light sensitive composition comprising an addition polymerizable ethylenically unsaturated monomer, a photopolymerization initiator and a polymer binder, wherein the photopolymerization initiator is a trihalomethyl group-containing oxadiazole compound represented by formula 1 or 2 above.

The trihalomethyl group-containing oxadiazole compound represented by formula 1 or 2 above will be explained below.

In formla 1, $R_1$ and $R_2$ independently represent a chemical bond, or a divalent group selected from a substituted or unsubstituted alkylene group, a substituted or unsubstituted alkyleneoxy group, an ether group, a carbonyl group, an ester group, a carbonylamino group or a sulfonylamino group, provided that $R_1$ and $R_2$ may be the same or different; X represents a chlorine atom or a bromine atom; Y represents a hydrogen atom or a substituted or unsubstituted alkyl group with a carbon atom number of from 1 to 8; and n is 2 or 3. Examples of the alkylene group represented by $R_1$ and $R_2$ include methylene, ethylene, propylene, propane-1,3-diyl, and dodecane-1,12-diyl. Examples of the alkyleneoxy group represented by $R_1$ and $R_2$ include oxymethylene, oxyethylene, and oxypropylene. Examples of the trihalomethyl group-containing oxadiazole compound represented by formula 1 include are those listed in the following table, but the invention is not specifically limited.

Formula 1

$Y_{(3-n)}X_nC\text{—}R_2\text{—}\underset{O}{\overset{N\text{—}N}{\diagdown\diagup}}\text{—}R_1\text{—}CX_nY_{(3-n)}$

| Compound | $R_1$ | $R_2$ | X | n |
|---|---|---|---|---|
| H-1 | Simple bond | Simple bond | Cl | 3 |
| H-2 | Simple bond | Simple bond | Br | 3 |
| H-3 | $CH_2$ | $CH_2$ | Cl | 3 |
| H-4 | $CH_2$ | $CH_2$ | Br | 3 |
| H-5 | $OCH_2$ | $OCH_2$ | Cl | 3 |
| H-6 | $OCH_2$ | $OCH_2$ | Br | 3 |
| H-7 | O | O | Cl | 3 |
| H-8 | O | O | Br | 3 |
| H-9 | OCO | COO | Cl | 3 |
| H-10 | $CH_2$—COO | COO—$CH_2$ | Br | 3 |
| H-11 | NH—CO | CO—NH | Cl | 3 |
| H-12 | NH—CO | CO—NH | Br | 3 |
| H-13 | $SO_2$—NH | NH—$SO_2$ | Cl | 3 |
| H-14 | $SO_2$—NH | NH—$SO_2$ | Br | 3 |

In formla 2, $R_1$ represents a chemical bond, or a divalent group selected from a substituted or unsubstituted alkylene group, a substituted or unsubstituted alkyleneoxy group, an ether group, a carbonyl group, an ester group, a carbonylamino group or a sulfonylamino group; X represents a chlorine atom or a bromine atom; Y represents a hydrogen atom or a substituted or unsubstituted alkyl group with a carbon atom number of from 1 to 8; n is 2 or 3; m is an integer of not less than 2; and A represents an m-valent organic group.

In formula 2, examples of the alkylene group represented by $R_1$ and $R_2$ include the same as those denoted in $R_1$ and $R_2$ of formula 1, and examples of the alkyleneoxy group represented by $R_1$ and $R_2$ include the same as those denoted in $R_1$ and $R_2$ of formula 1. The m-valent group is selected from a polyvalent aliphatic group, a polyvalent aromatic group, —O—, —S—, —CO—, —$NHSO_2$—, —NHCO—, —NH— of a combination thereof, and m is preferably from 2 to 8, and more preferably from 2 to 4. Typical examples of the m-valent group represented by A include alkylene (for example, methylene, ethylene, propylene, propane-1,3-diyl, ethane-1,1,2-triyl, dodecane-1,12-diyl), arylene (for example, phenylene), oxyalkylene (for example, oxyethylene, oxypropylene), iminoalkylene (for example, iminoethylene), oxaalkylene (for example, 2-oxapropane-1,3-diyl, 3-oxapentane-1,5-diyl), and azaalkylene (for example, 2-azapropane-1,3-diyl, 3-methyl-3-azapentane-1,5-diyl).

Examples of the trihalomethyl group-containing oxadiazole compound represented by formula 2 include those listed in the following table, but the invention is not specifically limited.

Formula 2

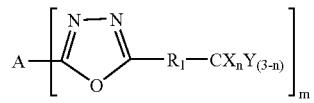

| Compound | A | $R_1$ | m | X | n | Y |
|---|---|---|---|---|---|---|
| H-15 | | Simple bond | 2 | Cl | 3 | |
| H-16 | | Simple bond | 2 | Br | 3 | |
| H-17 | | $CH_2$ | 2 | Cl | 3 | |
| H-18 | | $CH_2$ | 2 | Br | 3 | |
| H-19 | | $OCH_2$ | 2 | Cl | 3 | |
| H-20 | | $OCH_2$ | 2 | Br | 3 | |
| H-21 | | O | 2 | Cl | 3 | |
| H-22 | | O | 2 | Br | 3 | |
| H-23 | | COO | 2 | Cl | 3 | |
| H-24 | | COO—$CH_2$ | 2 | Br | 3 | |
| H-25 | | CO—NH | 2 | Cl | 3 | |
| H-26 | | CO—NH | 2 | Br | 3 | |
| H-27 | | NH—$SO_2$ | 2 | Cl | 3 | |
| H-28 | | NH—$SO_2$ | 2 | Br | 3 | |
| H-29 | | Simple bond | 2 | Cl | 2 | H |
| H-30 | | Simple bond | 2 | Br | 2 | H |

H-31

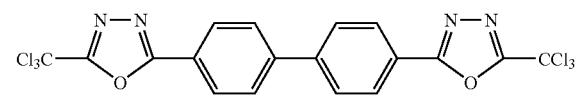

-continued
H-32
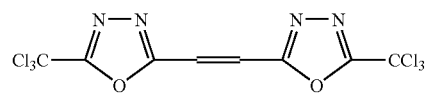
H-33
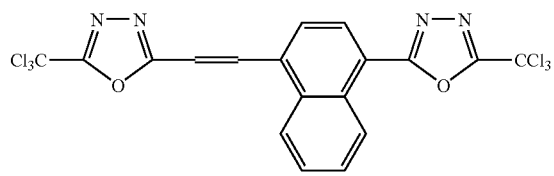
H-34
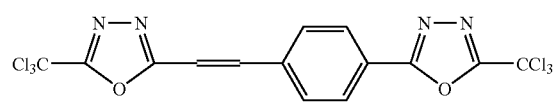
H-35
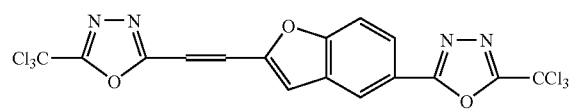
H-36
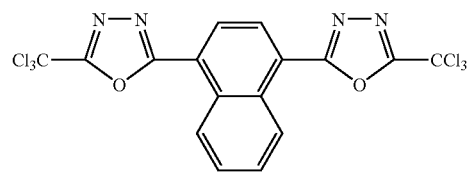
H-37
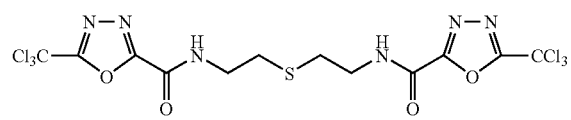
H-38
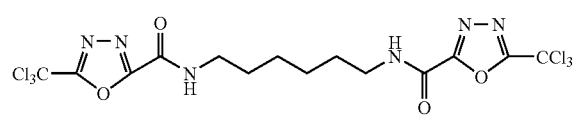
H-39
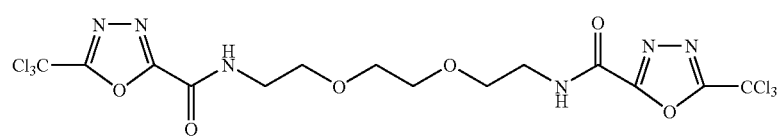
H-40
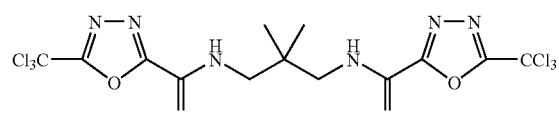
H-41
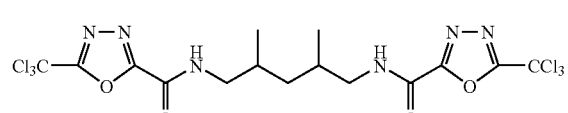
H-42
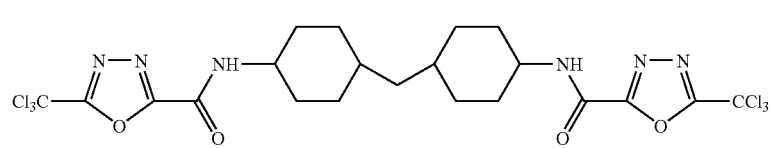
H-43
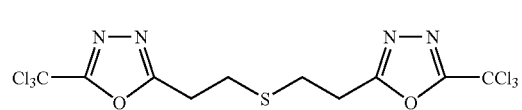
H-44
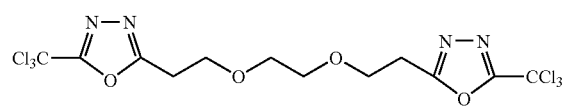
H-45
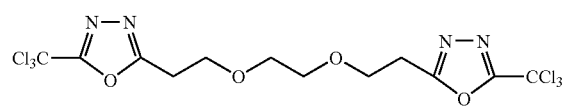

-continued
H-46
H-47
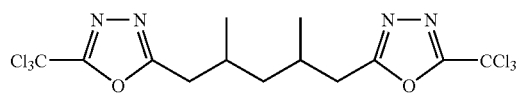
H-48
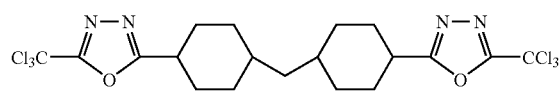
H-49
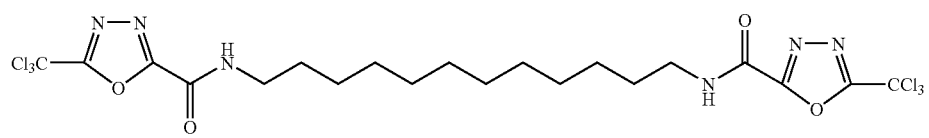
H-50
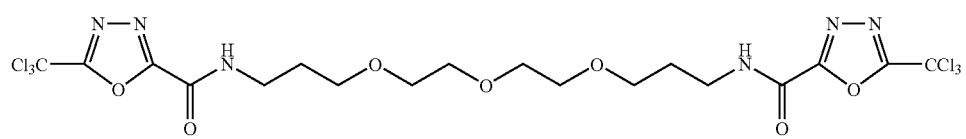
H-51
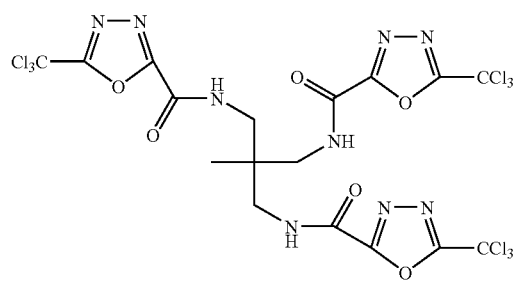
H-52
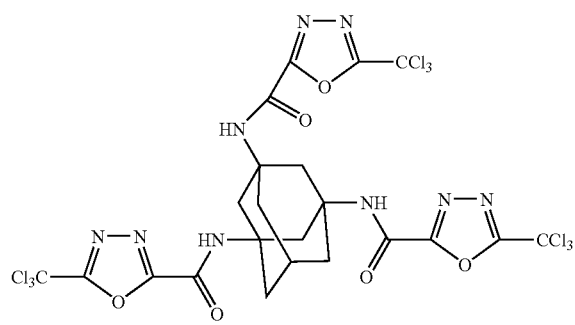
H-53
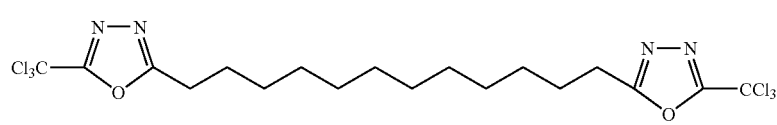
H-54
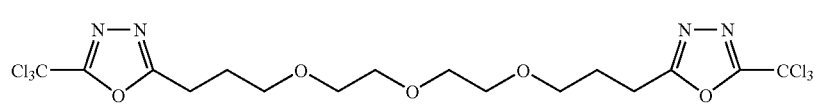
H-55
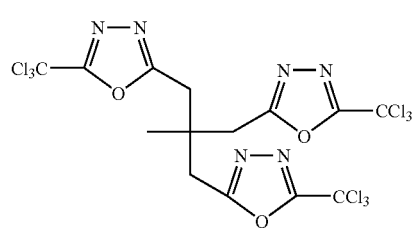
H-56
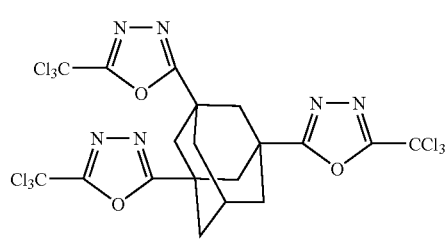

-continued
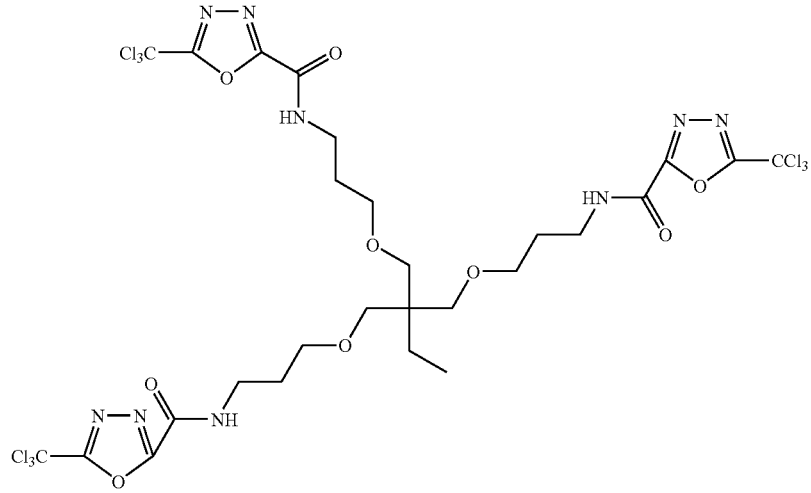
H-57
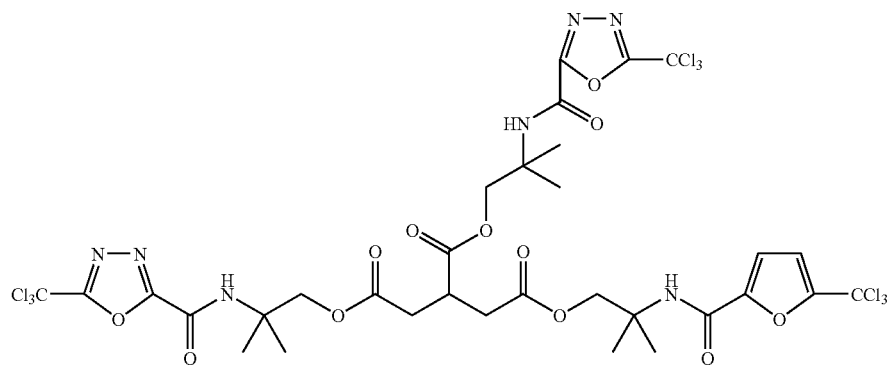
H-58
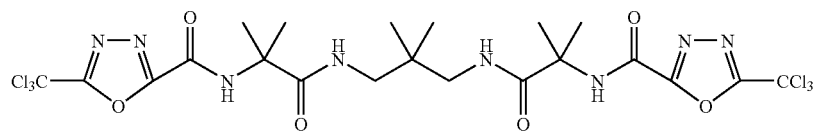
H-59
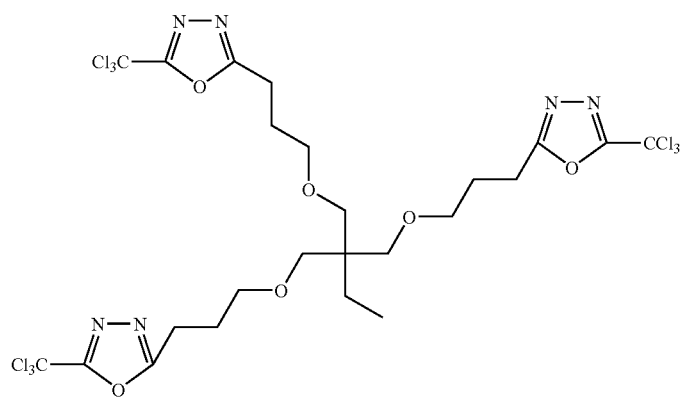
H-60

-continued

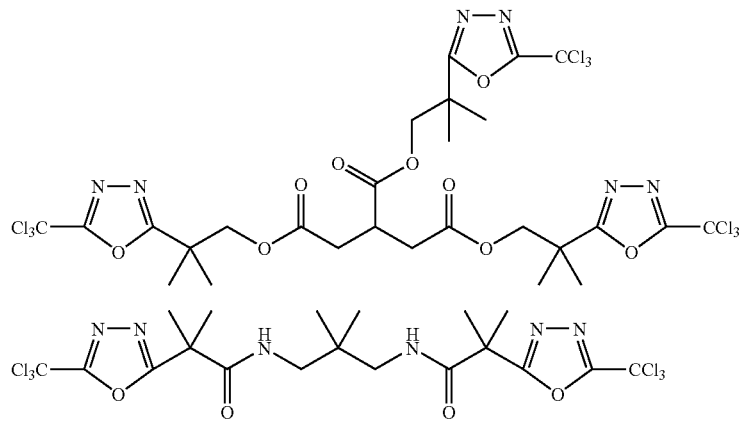

H-61

H-62

The compounds H-31 through H-62 are trichloromethyl group-containing compounds, but tribromomethyl group-containing compounds are suitably used in which the trichloromethyl group in H-31 through H-62 is replaced with the tribromomethyl group.

As a photopolymerization initiator used in combination with the trihalomethyl group-containing oxadiazole compound, there are titanocene compounds, monoalkyltriaryl borate compounds, and iron arene complexes.

Examples of the titanocene compound include those disclosed in Japanese Patent O.P.I. Publication Nos. 6341483 and 2-291. Preferred examples of the titanocene compound include bis(cyclopentadienyl)-Ti-dichloride, bis(cyclopentadienyl)-Ti-bisphenyl, bis(cyclopentadienyl)-Ti-bis-2,3,4,5, 6-pentafluorophenyl, bis(cyclopentadienyl)-Ti-bis-2,3,5,6-tetrafluorophenyl, bis(cyclopentadienyl)-Ti-bis-2,4,6-trifluorophenyl, bis(cyclopentadienyl)-Ti-bis-2,6-difluorophenyl, bis(cyclopentadienyl)-Ti-bis-2,4-difluorophenyl, di-methylcyclopentadienyl-Ti-bis-2,3,4,5,6-pentafluorophenyl, bis(methylcyclopentadienyl)-Ti-bis-2,3, 5,6-tetrafluorophenyl, bis(methylcyclopentadienyl)-Ti-bis-2,4-difluorophenyl (IRUGACURE 727L, produced by Ciba Specialty Co., Ltd.), bis(cyclopentadienyl)-bis(2,6-difluoro-3-(pyrryl)phenyl) titanium (IRUGACURE 784, produced by Ciba Specialty Co., Ltd.), bis(cyclopentadienyl)-bis(2,4,6-trifluoro-3-(pyrryl)phenyl) titanium, and bis(cyclopentadienyl)-bis(2,4,6-trifluoro-3-(2,5-dimethylpyrryl)phenyl) titanium.

As the monoalkyltriaryl borate compounds, there are those described in Japanese Patent O.P.I. Publication Nos. 62-150242 and 62-143044. Preferred examples of the monoalkyl-triaryl borate compounds include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

As the iron arene complexes, there are those described in Japanese Patent O.P.I. Publication No. 59-219307. Preferred examples of the iron arene complex include 1-benzene-(η-cyclopentadienyl)iron•hexafluorophosphate, η-cumene)-(η-cyclopentadienyl)iron•hexafluorophosphate, η-fluorene-(η-cyclopentadienyl)iron•hexafluorophosphate, η-naphthalene-(η-cyclopentadienyl)iron•hexafluorophosphate, η-xylene-(η-cyclopentadienyl)iron•hexafluorophosphate, and η-benzene-(η-cyclopentadienyl)iron•hexafluoroborate.

Another photopolymerization initiator can be used in combination. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No. 1,459,563. Typical examples of the photopolymerization initiator used in combination include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-1-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I.

Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344.

When a laser is employed as a light source, the light sensitive layer in the invention preferably contains a dye. The dye has an absorption maximum in the wavelength regions of from 350 to 1200 nm, and preferably from 390 to 430 nm. A dye having an absorption maximum around a wavelength of light is preferably used.

Examples of the sensitizing dyes, which can induce sensitivity to the wavelengths of visible to near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, ketoalcohol borate complexes, xanthene dyes, eosin dyes, and compounds disclosed in European Patent No. 568,993, U.S. Pat. Nos. 4,508,811 and 5,227,227, and Japanese Patent O.P.I. Publication Nos. 2001-125255 and 11-271969. A typical combination of the above photopolymerization initiator and the sensitizing dye is disclosed in Japanese Patent O.P.I. Publication Nos. 2001-125255 and 11-271969.

The content of the photopolymerization initiator is not specifically limited, but is preferably from 0.1 to 20 parts by weight based on 100 parts by weight of the photopolymerizable monomer. The content ratio by mol of the photopolymerization initiator to the sensitizing dye in the light sensitive composition of the invention is preferably from 1:100 to 100:1.

As the addition polymerizable ethylenically unsaturated monomer in the invention, there are a known monomer such as a radical polymerizable monomer, and a polyfunctional monomer or oligomer having two or more of an ethylenic double bond in the molecule generally used in an ultraviolet curable resin composition. The monomers are not specifically limited.

Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A•epichlorhydrin•(meth)acrylic acid or phenol novolak•epichlorhydrin•(meth)acrylic acid obtained by incorporating (meth)acrylic acid in an epoxy resin; an urethaneacrylate such as ethylene glycol-adipic acid•tolylenediisocyanate•2-hydroxyethylacrylate, polyethylene glycol•tolylenediisocyanate•2-hydroxyethylacrylate, hydroxyethylphthalyl methacrylate•xylenediisocyanate, 1,2-polybutadieneglycol•tolylenediisocyanate•2-hydroxyethylacrylate or trimethylolpropane-propylene glycol•tolylenediisocyanate•2-hydroxyethylacrylate, obtained by incorporating (meth)acrylic acid in an urethane resin; a silicone acrylate such as polysiloxane acrylate, or polysiloxane•diisocyanate•2-hydroxyethylacrylate; an alkyd modified acrylate obtained by incorporating a methacroyl group in an oil modified alkyd resin; and a spiran resin acrylate.

The light sensitive composition of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer used in the invention is preferably a phosphate compound having at least one (meth) acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UVEB•Koka Handbook (Materials)" edited by Kobunshi Kankokai can be suitably used. Of these compounds, compounds having two or more acryl or meth-acryl groups in the molecule are preferable, and those having a molecular weight of not more than 10,000, and preferably not more than 5,000 are more preferable.

In the invention, an addition polymerizable ethylenically unsaturated monomer having a tertiary amino group in the molecule is preferably used. Its molecular structure is not limited, but those are preferred in which a tertiary amine having a hydroxyl group is modified with glycidyl methacrylate, methacrylic chloride, or acrylic chloride. Examples thereof include a polymerizable compound disclosed I Japanese Patent O.P.I. Publication Nos. 1-165613, 1-203413 and 1-197213.

A reaction product of a polyhydric alcohol having a tertiary amino group in the molecule, a diisocyanate and a compound having a hydroxyl group and an addition polymerizable ethylenically double bond in the molecule is preferably used in the invention. can be synthesized according to the same method as a conventional method in which a urethaneacrylate compound is ordinarily synthesized employing a diol, a diisocyanate and an acrylate having a hydroxyl group.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N, N', N'-tetra-2-hydroxypropylethylenediamine, p-tolyldiethanolamine, N,N,N',N'-tetra-2-hydroxyethylethylenediamine, N,N-bis (2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule include the following compounds MH-1 through MH-13, but the invention is not specifically limited thereto.

MH-1

MH-2

MH-3

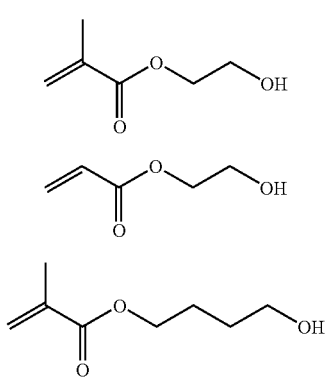

MH-4

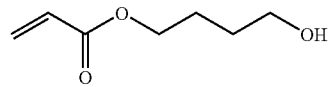

MH-5

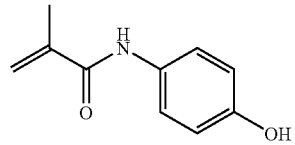

MH-6

MH-7

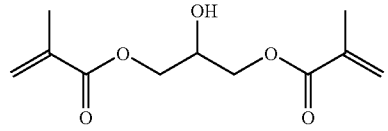

MH-8

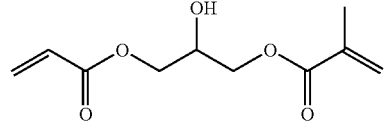

MH-9

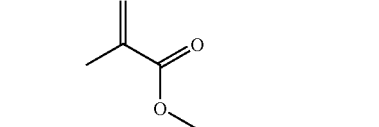

MH-10

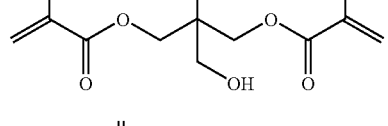

MH-11

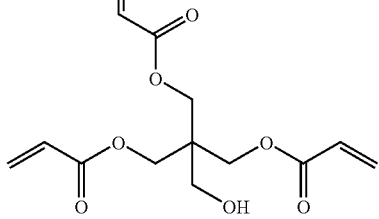

MH-12

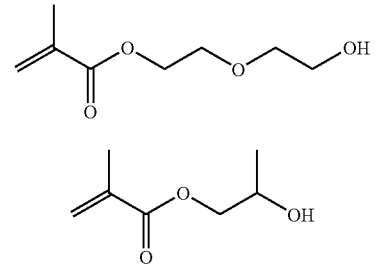

MH-13

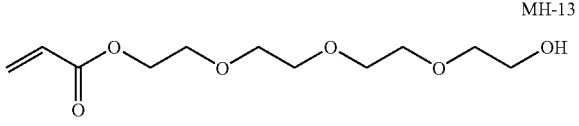

Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

In addition to the above, acrylates or methacrylates disclosed in Japanese Patent O.P.I. Publication Nos. 2-105238 and 1-127404 can be used.

As the polymer binder used in the invention can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl) acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine;

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomers.

As the polymer binder is also preferred an unsaturated bond-containing copolymer which is obtained by reacting a carboxyl group contained in the above vinyl copolymer molecule with for example, a compound having a (meth) acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

The content of the polymer binder in the light sensitive composition is preferably from 10 to 90% by weight, more preferably from 15 to 70% by weight, and still more preferably from 20 to 50% by weight, in view of sensitivity.

The acid value of the polymer binder is preferably from 10 to 150, more preferably from 30 to 120, and still more preferably from 50 to 90, in view of balance of polarity of the photopolymerizable light sensitive layer.

The polymer binder contains a unit having an ethylenically double bond as a reactive group-containing unit in an amount of preferably from 2 to 70 mol %, and more preferably from 10 to 50 mol %, in view of sensitivity or printing durability.

The light sensitive planographic printing plate material of the invention comprises a photopolymerizable light sensitive layer and preferably an oxygen shielding layer as described later. A polymerization inhibitor may be added to these layers, in order to prevent undesired polymerization of the ethylenically unsaturated monomer during the manufacture or after storage of the light sensitive planographic printing plate. Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthyl-benzyl)-4-methylphenyl acrylate.

The polymerization inhibitor content is preferably 0.01 to 5% by weight based on the total solid content of the layer. Further, in order to prevent polymerization induced by oxygen, a higher fatty acid such as behenic acid or a higher fatty acid derivative such as behenic amide may be added to the layer. The higher fatty acid or higher fatty acid derivative content is preferably 0.5 to 10% by weight based on the total solid content of the layer. A surfactant may be added to the layer in order to improve coatability of the layer. Examples of the surfactant include a nonionic surfactant, a cationic surfactant, an anionic surfactant, a silicon-contained surfactant, and a fluorine-contained surfactant. The fluorine-contained surfactant is preferred.

Further, in order to improve physical properties of the cured light sensitive layer after exposure, the layer can contain an inorganic filler or a plasticizer such as dioctyl phthalate, dimethyl phthalate or tricresyl phosphate. The content of such a material is preferably not more than 10% by weight, based on the total solid content of the light sensitive layer.

The photopolymerizable light sensitive layer of the light sensitive planographic printing plate material of the invention preferably contains a light-to-heat conversion material. The light-to-heat conversion material will be explained below.

(Infrared Absorbing Dye)

Examples of the light-to-heat conversionl material include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversionl materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589, 3-103476, 11-240270, 11-309952, 11-265062, 2000-1060, 2000-309174, 2001-152965, 2002-144750, and 2001-219667. These compounds may be used singly or in combination.

(Pigment)

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm.

(Graphite)

The graphite is one having a particle size of preferably not more than 0.5 µm, more preferably not more than 100 nm, and most preferably not more than 50 nm.

(Metal)

As the metal, any metal can be used as long as the metal is in a form of fine particles having preferably a particle size of not more than 0.5 µm, more preferably not more than 100 nm, and most preferably not more than 50 nm. The metal may have any shape such as spherical, flaky and needle-like. Colloidal metal particles such as those of silver or gold are particularly preferred.

(Metal Oxide)

As the metal oxide, materials having black color in the visible regions or materials which are electro-conductive or semi-conductive can be used. Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2On.nTiO_2$ with these metal oxides is usable. The particle size of these particles is preferably not more than 0.5 µm, more preferably not more than 100 nm, and most preferably not more than 50 nm.

Among these light-to-heat conversionl materials, black complex metal oxides containing at least two metals are preferred. Typically, the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light-to-heat conversionl efficiency as compared with another metal oxide.

The primary average particle size of these complex metal oxides is preferably from 0.001 to 1.0 µm, and more preferably from 0.01 to 0.5 µm. The primary average particle size of from 0.001 to 1.0 µm improves a light-to-heat conversionl efficiency relative to the addition amount of the particles, and the primary average particle size of from 0.05 to 0.5 µm further improves a light-to-heat conversionl efficiency relative to the addition amount of the particles. The light-to-heat conversionl efficiency relative to the addition amount of the particles depends on a dispersity of the particles, and the well-dispersed particles have a high light-to-heat conversionl efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of the complex metal oxide particles.

The addition amount of the light-to-heat material is preferably 0.1 to 50% by weight, more preferably 1 to 30% by weight, and most preferably 3 to 25% by weight based on the weight of light sensitive layer.

A coating solution, in which the above-described materials are dissolved in an appropriate organic solvent, is coated on a support according to a conventional method, and dried to obtain a light sensitive photopolymerizable layer. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method. A low drying temperature of the coated light sensitive layer cannot provide sufficient printing durability, while too a high drying temperature of the coated light sensitive layer results in marangoni and produces fog at non-image portions. The drying temperature is preferably from 60 to 160° C., more preferably from 80 to 140° C., and still more preferably from 90 to 120° C.

In the light sensitive planographic printing plate material of the invention, an oxygen-shielding layer comprised mainly of a water soluble vinyl polymer may be provided on the photopolymerizable light sensitive layer. Examples of the water soluble vinyl polymer include polyvinyl alcohol, its partial ester compound, its partial ether compound, its partial acetal compound and a water soluble copolymer having a vinyl alcohol unit. As the polyvinyl alcohol, one having a degree of polymerization of from 300 to 2400, in which vinyl acetate of from 71 to 100% is hydrolyzed, is preferably used.

Examples of the polyvinyl alcohol include NK-05, KL-05, KP-06, KP-08, KM-11, MKH-17, KH-20, L-3266, GL-03, GL-05, GM-14, EG-05, EG-30, GH-17, EG-40, GH-20, GH-23, AL-06, AH-17, AH-26, CKS-50, Z-100, NM-11, NM-14, Z-200, N-300, T-330H, NH-20, NH-26, each produced by Nippon Gosei Kagaku Kogyo Co., Ltd., and PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, or L-8, each produced by Kuraray Co., Ltd. Examples of the copolymer described above include polyvinyl acetate, polyvinyl chloroacetate, and polyvinyl propionate, in which the vinyl ester of from 88 to 100% is hydrolyzed, polyvinyl formal, polyvinyl acetal, and a copolymer thereof.

Other useful polymers include polyvinyl pyrrolidone, polyethylene imine, water soluble polyamide, ethylene-vinyl acetate copolymer, polyvinylidene chloride, acrylonitrile resin, ethylene-vinyl alcohol copolymer, gelatin and gum arabic. These polymers can be used alone or as a mixture of two or more kinds thereof. As a solvent for the oxygen shielding layer coating solution, water is preferably used, but a mixture solvent of water and alcohols such as methanol and ethanol, or ketones such as acetone and methyl ethyl ketone can be used. The solid content of the coating solution is preferably from 1 to 20% by weight. To the coating solution may be added a surfactant or a matting agent to improve coatability of the layer or a water soluble plasticizer or a known additive to improve physical properties of the layer. Examples of the water soluble plasticizer include propionamide, cyclohexane diol, glycerin, and sorbitol. A water soluble (meth)acryl resin can be also added to the solution.

Coating of the oxygen shielding layer can be carried out according to the same coating method as the photopolymerizable light sensitive layer described above. The drying temperature of the oxygen shielding layer coating is preferably lower than that in the photopolymerizable light sensitive layer coating. The difference between drying temperature in the oxygen shielding layer coating and that in the photopolymerizable light sensitive layer coating is more preferably not less than 10° C., and still more preferably not less than 20° C. Herein, the upper limit of the difference is preferably at most around 50° C. The drying temperature of the layer is preferably lower than the glass transition point (Tg) of the polymer binder contained in the light sensitive layer. The difference between drying temperature of the layer coating and the glass transition point (Tg) of the polymer binder of the light sensitive layer is preferably not less than 20° C., and more preferably not less than 40° C. Herein, the upper limit of the difference is preferably at most around 60° C. The thickness of the oxygen shielding layer is preferably from 0.1 to 5.0 µm, and more preferably from 0.5 to 3.0 µm.

A support is used in the light sensitive planographic printing plate material in the invention. Examples of the support include a plate of a metal such as aluminum, stainless steel, chromium, or nickel, a plastic film such as a polyester film, a polyethylene film or a polypropylene film which is deposited or laminated with the above-described metal, and a polyester film, a polyvinyl chloride film or a nylon film whose surface is subjected to hydrophilization treatment. Among the above, the aluminum plate is preferably used, and may be a pure aluminum plate or an aluminum alloy plate. As the aluminum alloy, there can be used various ones including an alloy of aluminum and a metal such as silicon, copper, manganese, magnesium, chromium, zinc, lead, bismuth, nickel, titanium, sodium or iron.

It is preferable that the support is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone.

As the surface roughening methods, there are a mechanical surface roughening method and an electrochemical surface roughening method. The support is preferably surface-roughened by the electrochemical treatment in an acidic medium, and in this case the mechanical surface roughening method may be used in combination.

Though there is no restriction for the electrochemical surface roughening method, a method in which the support is electrochemically surface roughened in an acidic medium, i.e., an acidic electrolytic solution. Though an acidic electrolytic solution generally used for the electrochemical surface roughening can be used, it is preferable to use an electrolytic solution of hydrochloric acid or that of nitric acid. The electrochemical surface roughening method disclosed in Japanese Patent Publication No. 48-28123, British Patent No. 896,563 and Japanese Patent O.P.I. Publication No. 53-67507 can be used.

In the electrochemical surface roughening method, voltage applied is generally from 1 to 50 V, and preferably from 10 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$.

The temperature during the electrochemically surface roughening may be in the range of from 10 to 50° C., and is preferably from 15 to 45° C. When the support is electrochemically surface roughened by using an electrolytic solution of nitric acid, DC or AC voltage applied is generally from 1 to 50 V, and preferably from 5 to 30 V. The current density used can be selected from the range from 10 to 200 $A/dm^2$, and is preferably from 20 to 100 $A/dm^2$. The quantity of electricity can be selected from the range of from 100 to 5000 $C/dm^2$, and is preferably 100 to 2000 $C/dm^2$. The temperature during the electrochemically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid. When the support is electrochemically surface roughened by using an electrolytic solution of hydrochloric acid, AC or DC voltage applied is generally from 1 to 50 V, and preferably from 2 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrochemically surface roughening may be in the range of from 10 to 50° C., and is preferably from 15 to 45° C. The hydrochloric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

After the support has been electrochemically surface roughened, it is preferably subjected to desmut treatment, in which the support is dipped in an acid or an aqueous alkali solution, in order to remove smut produced on the support surface. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 μm are dispersed in water to the surface of the support. The honing roughening method is carried out by ejecting obliquely slurry with pressure applied from nozzles to the surface of the support, the slurry containing volcanic ash particles with a particle size of 10 to 100 μm dispersed in water. A surface roughening can be also carried out by laminating a support surface with a sheet on the surface of which abrading particles with a particle size of from 10 to 100 μm was coated at intervals of 100 to 200 μm and at a density of $2.5 \times 10^3$ to $10 \times 10^3/cm^2$, and applying pressure to the sheet to transfer the roughened pattern of the sheet and roughen the surface of the support. After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrochemical surface roughening may be used individually or in combination.

After the surface roughening, anodizing treatment is carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 $A/dm^2$ to an aqueous solution containing sulfuric acid and/or phosphoric acid in a concentration of from 10 to 50%, as an electrolytic solution. However, it is also possible to use a method of carrying out anodizing treatment applying a high current density to sulfuric acid as described in U.S. Pat. No. 1,412,768, a method of carrying out anodizing treatment employing phosphoric acid as described in U.S. Pat. No. 3,511,661, or a method of carrying out anodizing treatment employing a solution containing two or more kinds of chromic acid, oxalic acid, malonic acid, etc. The coated amount of the formed anodization film is suitably 1 to 50 $mg/dm^2$, and preferably 10 to 40 $mg/dm^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support, which has been subjected to anodizing treatment, is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment or anodizing treatment, the support is preferably surface treated with an aqueous polyvinyl phosphonic acid solution. The solvent for the aqueous solution is preferably water or a mixture of water and alcohol. The aqueous polyvinyl phosphonic acid solution contains polyvinyl phosphonic acid in an amount of preferably from 0.01 to 30%, and more preferably from 0.05 to 10%. The concentration less than the above lower limit of the polyvinyl phosphonic acid does not sufficiently provide the effect of the invention, and the concentration more than the above upper limit of the polyvinyl phosphonic acid provides too high viscosity, which is difficult to handle.

To the aqueous solution can be further added a compound other than polyvinyl phosphonic acid. Examples of the compound include known water soluble resins, water dispersible inorganic particles, acids or bases. Typical water soluble resins include polyvinyl alcohol, polysaccharide, polyvinyl pyrrolidone, polyethylene glycol, gelatin, glue, casein, hydroxyethyl cellulose, carboxymethyl cellulose, methylcellulose, hydroxyethyl starch, sucrose octacetate, ammonium alginate, sodium alginate, polyvinyl amine, polyallyl amine, polystyrene sulfonic acid, polyacrylic acid, a water soluble polyamide, and maleic anhydride copolymer. The water dispersible inorganic particles include necklace colloidal silica particles disclosed in Japanese Patent O.P.I. Publication No. 2001-232746, and colloidal silica particles. The acids include phosphoric acid, sulfuric acid, nitric acid, hydrochloric acid, and another strong acid. The bases include sodium hydroxide, potassium hydroxide, calcium hydroxide, ammonium hydroxide, tetramethylammonium hydroxide, and tetrabutylammonium hydroxide.

In the invention, the concentration of the compounds used together with polyvinyl phosphonic acid in the aqueous solution is preferably from 0 to 40% and more preferably from 0 to 20%.

The support processed as above is treated with the aqueous polyvinyl phosphonic acid solution for preferably from 0.5 seconds to 3 minutes, more preferably from 1 second to 1 minute, and still more preferably from 2 to 45 seconds. The above time range is preferred, since treating time less than 0.5 seconds lowers the advantageous effects of the invention, while treating time more than 3 minutes results in poor productivity. The support processed as above is treated with the aqueous polyvinyl phosphonic acid solution at preferably from 40 to 100° C., and at more preferably from 50 to 90° C. The above temperature range is preferred, since temperature less than 40° C. lowers the advantageous effects of the invention, while more than 100° C. results in poor productivity.

The light sources for forming an image on the light sensitive planographic printing plate material of the invention include, for example, a laser, an emission diode, a xenon flush lamp, a halogen lamp, a carbon arc light, a metal halide lamp, a tungsten lamp, a high pressure mercury lamp, and a non-electrode light source. When the light sensitive planographic printing plate material is imagewise exposed at one time, a mask material having an image pattern made of a light shielding material is put on the plate to be in close contact with the plate, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material. When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As light sources for exposing the light sensitive layer comprising a dye having an absorption maximum in the wavelength regions of from 350 to 1200 nm, those described below are preferred.

Laser sources emitting a 350 to 450 nm laser are as follows.

A gas laser such as an Ar ion laser (364 nm and 351 nm), a Kr ion laser (356 nm, 351 nm), a He—Cd laser (441 nm), a solid laser such as a laser employing two of a combination of ND:YAG (YVO4) and SHG crystal (355 nm), or a laser employing a combination of Cr:LiSAF and SHG crystal (430 nm), a semiconductor laser such as $KnbO_3$, ring resonator (430 nm), a combination of a guiding wavelength conversion element, and AlGaAs, InGaAs semiconductor (300 to 450 nm), a combination of a guiding wavelength conversion element, and AlGaInP, InGaAs semiconductor (300 to 350 nm), AlGaInN (350 to 450 nm), and a pulse laser such as an $N_2$ laser (337 nm, pulse: 0.1 to 10 mJ) or an XeF laser (351 nm, pulse: 10 to 250 mJ) The especially preferred one is an AlGaInN semiconductor laser (an InGaN type semiconductor laser available on the market, 400 to 410 nm), which is suitable in view of wavelength characteristics and cost performance.

As a light source available emitting a 450 to 700 nm light, an $Ar^+$ laser (488 nm), a YAG-SHG laser (532 nm), an He—Ne laser (633 nm), or an Hd-Cd laser, or a red semiconductor laser (650 to 690 nm) can be used, and as a light source available emitting a 700 to 1200 nm light, a semiconductor laser (800 to 850 nm) or an Nd-YAG laser (1064 nm) can be used.

The oxadiazole compound in the invention represented by formula 1 or 2 above, when exposed to a high output near infrared laser, produces an acid and/or a radical heat generated by a light-to-heat conversion material such as a coloring agent, and initiates polymerization, which is preferred. Further, the oxadiazole compound in the invention, when exposed to a laser with a wavelength not longer than a visible wavelength, can initiate a high-speed polymerization due to photoreaction with high efficiency, which is preferred. The present inventors have found that in both cases above the oxadiazole compound in the invention exhibits high performance as compared with a known oxadiazole compound or a known triazine compound, and have completed the invention.

Besides the above can be used a super high pressure, high pressure, intermediate pressure or low pressure mercury lamp, a chemical lamp, a carbon arc lamp, a xenon lamp, a metal halide lamp, an an ultraviolet laser lamp (an ArF excimer laser or a KrF excimer laser), and radiations such as electron beam, X-rays, ion beam or far infrared rays. The preferred are lasers emitting light with a wavelength of not less than 350 nm in view of cost performance.

A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound, is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium.

In the invention, the imagewise exposed light sensitive planographic printing plate material is developed as described below.

A developer or developer replenisher used in the development preferably contains at least one compound selected from silicic acid, phosphoric acid, carbonic acid, phenols, saccharides, and fluorinated alcohols. The pH of the developer is preferably from more than 8.5 to less than 13.0, and more preferably from 8.5 to 12. Of the above compounds, weak acid compounds such as phenols, saccharides, oximes, and fluorinated alcohols have an acid dissociation constant (pKa) of preferably from 10.0 to 13.2. Such acid compounds are selected from those described in "IONIZATION CONSTANTS OF ORGANIC ACIDS IN AQUEOUS SOLUTION" published by Pergamon Press Co. Ltd. Examples thereof include phenols having a phenolic hydroxyl group such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfosalicylic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27), and m-cresol (pKa: 10.09).

As the saccharides, non-reducing saccharides, which are stable in an alkali solution, are preferably used. The non-reducing saccharides are those which do not have a free aldehyde group or ketone group, and therefore do not have reducibility. They are classified into trehalose type oligosaccharides in which monosaccharides combine with each other through the reducing groups, glycosides in which saccharides combine with another compound through their reducing group, and sugar alcohols obtained by reducing saccharides, each of which can be suitably used in the invention. Examples of the trehalose type oligosaccharide include trehalose and saccharose. Examples of the glycosides include alkyl glycosides, phenol glycosides, and mustard oil glycoside. Examples of the sugar alcohols include D,L-arabitol, ribitol, xylitol, D,L-sorbitol, D,L-mannitol, D,L-iditol, D,L-talitol, D,L-dulcitol, and D,L-allodulcitol.

Maltitol obtained by hydrogenation of disaccharides or reduced oligosaccharides (reduced starch syrup) obtained by hydrogenation of oligosaccharides are suitably used. Examples of the oximes include 2-butanoneoxime (pKa: 12.45), acetoxime (pKa: 12.42), 1,2-cycloheptanedioxime (pKa: 12.3), 2-hydroxybenzaldehideoxime (pKa: 12:10), dimethylglyoxime (pKa: 12.9), ethanediamidedioxime (pKa: 11.37), acetophenoneoxime (pKa: 11.35). Examples of the fluorinated alcohols include 2,2,3,3-tetrafluoropropanol-1 (pKa: 12.74), trifluoroethanol (pKa: 12.37), and trichloroethanol (pKa: 12.24). Further, aldehydes, nucleic acid related substances or other weak acids are used.

Examples of the aldehydes include pyridine-2-aldehyde (pKa: 12.68) and pyridine-4-aldehyde (pKa: 12.05). Examples of the nucleic acid related substances include adenosine (pKa: 12.56), inosine (pKa: 12.5), guanine (pKa: 12.3), cytosine (pKa: 12.2), hypoxanthine (pKa: 12.1), and xanthine (pKa: 11.9). Examples of the other weak acids include diethylaminomethylsulfonic acid (pKa: 12.32), 1-amino-3,3,3-trifluorobenzoic acid (pKa: 12.29), isopropylidenedisulfonic acid (pKa: 12.10), 1,1-ethylenediphosphonic acid (pKa: 11.54), 1,1-diethylidenedisulfonic acid-1-hydroxy (pKa: 11.52), benzimidazole (pKa: 12.86), thiobenzamide (pKa: 12.8), picolinthioamide (pKa: 12.55), and barbituric acid (pKa: 12.5).

These acid compounds can be used singly or as a mixture of two or more thereof. Of these compounds, silicic acid, phosphoric acid, sulfosalicylic acid, salicylic acid, sugar alcohol, and saccharose are preferred, and silicic acid, D-sorbitol, saccharose, and reduced starch syrup are particularly preferred, since they are inexpensive and show buffering action in appropriate pH regions. These weak acid compounds are contained in the developer or developer replenisher in an amount of preferably from 0.1 to 30% by weight, and more preferably from 1 to 20% by weight. When the content of the weak acid compound is less than 0.1%, it does not provide a sufficient buffering effect, while when the content of the weak acid compound is more than 30%, such a concentration is too high to obtain a developer or developer replenisher, resulting in cost increase. The alkali agents used in combination with the above acid compounds include sodium hydroxide, potassium hydroxide, ammonium hydroxide and lithium hydroxide.

These alkali agents may be used singly or in combination of two or more kinds thereof. The image portions of a printing plate obtained by developing a light sensitive planographic printing plate material with a developer with a pH of not more than 8.5 show low mechanical strength and is low in mechanical strength, and is likely to be abraded during printing, resulting in lowering of printing durability. Further, the resulting image portions are chemically low, and are low in resistance to chemicals such as ink cleaning agent or a plate cleaner used in printing, resulting in poor chemical resistance. In contrast, a developer with a pH of from more than 13.0 shows strong skin irritation and must be carefully handled, and such a developer is undesired.

Other examples of the alkali agents in the invention include potassium silicate, sodium silicate, lithium silicate, ammonium silicate, potassium metasilicate, sodium metasilicate, lithium metasilicate, ammonium metasilicate, potassium phosphate, sodium phosphate, lithium phosphate, ammonium phosphate, potassium hydrogenphosphate, sodium hydrogenphosphate, lithium hydrogenphosphate, ammonium hydrogenphosphate, potassium carbonate, sodium carbonate, lithium carbonate, ammonium carbonate, potassium hydrogencarbonate, sodium hydrogencarbonate, lithium hydrogencarbonate, ammonium hydrogencarbonate, potassium borate, sodium borate, lithium borate, and ammonium borate. In order to adjust pH of the developer, sodium hydroxide, potassium hydroxide, ammonium hydroxide and lithium hydroxide can be used.

Organic alkali agents, including monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine, are also used in combination with the above compounds.

The preferred alkali agent is potassium silicate or sodium silicate. The concentration of silicate in the developer is preferably from 1.0 to 3.0% by weight in terms of $SiO_2$ concentration. The ratio by mole (SiO$_2$/M) of SiO$_2$ to alkali metal M is preferably from 0.25 to 2.

The developer in the invention refers to a developer (so-called working developer) replenished with developer replenisher in order to maintain activity of the developer which lowers during development of light sensitive planographic printing plate material, as well as fresh developer used at the beginning of development. The developer replenisher is required to be higher in activity (for example, in alkali agent concentration) than the working developer, and may have a pH exceeding 13.0.

Various surfactants or organic solvents can be optionally added to a developer or a developer replenisher used in the invention, in order to accelerate development, disperse smuts occurring during development, or enhance ink receptivity at the image portions of a printing plate.

Preferred examples of the surfactant include an anionic surfactant, a cationic surfactant, a nonionic surfactant, and an amphoteric surfactant. Examples of the nonionic surfactant include polyoxyethylenealkyl ethers, polyoxyethylenealkylphenyl ethers, polyoxyethylene-polystyrylphenyl ethers, polyoxyethylenepolyoxypropylenalkyl ethers, partial esters of glycerin and fatty acids, partial esters of sorbitan and fatty acids, partial esters of pentaerythritol and fatty acids, propylene glycol monofatty acid ester, partial esters of sucrose and fatty acids, partial esters of polyoxyethylenesorbitan and fatty acids, partial esters of polyoxyethylenesorbitol and fatty acids, esters of polyoxyethylene glycol and fatty acids, partial esters of polyglycerin and fatty acids, polyoxyethylene castor oil, partial esters of polyoxyethyleneglycerin and fatty acids, polyoxyethylene-polyoxypropylene block copolymer, adduct of polyoxyethylene-polyoxypropylene block copolymer with ethylene imine, fatty acid diethanolamides, N,N-bis-2-hydroxyalkylamines, polyoxyethylenealkylamines, triethanolamine fatty acid esters, and trialkylamine oxides. Examples of the anionic surfactant include fatty acid salts, abietic acid salts, hydroxyalkane sulfonic acid salts, alkane sulfonic acid salts, dialkylsulfosuccinic acid salts, straight-chained alkylbenzene sulfonic acid salts, branched alkylbenzene sulfonic acid salts, alkylnaphthalene sulfonic acid salts, alkyldiphenylether sulfonic acid salts, alkylphenoxypolyoxyethylenepropyl sulfonic acid salts, polyoxyethylenealkyl sulfophenylether salts, N-methyl-N-oleiltaurine sodium salts, N-alkylsulfosuccinic acid monoamide disodium salts, petroleum sulfonic acid salts, nitrated castor oil, sulfated beef tallow, fatty acid alkyl ester sulfate salts, alkylsulfate salts, polyoxyethylenealkylethersulfate salts, fatty acid monoglyceride sulfate salts, polyoxyethylenealkylphenylethersulfate salts, polyoxyethylenestyrylphenylethersulfate salts, alkylphosphate salts, polyoxyethylenealkyletherphosphate salts, polyoxyethylenealkylphenyletherphosphate salts, partial saponification products of styrene-maleic anhydride copolymers, partial saponification products of olefin-maleic anhydride copolymers, and condensates of naphthalene sulfonic acid salts with formalin. Examples of the cationic surfactant include alkylamine salts, quaternary ammonium salts such as tetrabutylammonium bromide, polyoxyethylene alkylamine salts, and polyethylene polyamine derivatives. Examples of the amphoteric surfactant include carboxybetains, aminn carboxylic acids, sulfobetaines, aminosulfates and imidazolines. The "polyoxyethylene" described above can be replaced with polyoxyalkylene such as polyoxymethylene, polyoxypropylene, or polyoxybutylene.

A more preferred surfactant is a fluorine-containing surfactant having a perfluoroalkyl group in the molecule. Examples thereof include anionic surfactants such as perfluoroalkylcarboxilic acid salts, or perfluoroalkylsurfuric acid salts, amphoteric surfactants such as perfluorobetaines, cationic surfactants such as perfluoroalkyltrimethylammonimum chlorides, and nonionic surfactants such as perfluoroalkylamineoxides, perfluoroalkylethyleneoxide adducts, oligomers having a perfluoroalkyl group and a hydrophilic group, oligomers having a perfluoroalkyl group and an oleophilic group, oligomers having a perfluoroalkyl group, a hydrophilic group, and an oleophilic group, and urethanes having a perfluoroalkyl group and an oleophilic group. These surfactants can be used singly or as a mixture of two or more thereof. The developer preferably contains the surfactant in an amount of preferably from 0.001 to 10% by weight, and more preferably from 0.01 to 5% by weight.

The developer or developer replenisher used in the invention optionally contains a development stabilizing agent. The preferred examples of the development stabilizing agent include an adduct of sugar alcohol with polyethylene glycol, tetraalkylammonium hydroxide such as tetrabutylammonium hydroxide, a phosphonium salt such as tetrabutylphosphonium bromide, and an iodonium salt such as diphenyliodonium chloride, as disclosed in Japanese Patent O.P.I. Publication No. 6-282079. Examples of the development stabilizing agent include anionic surfactants or amphoteric surfactants disclosed in Japanese Patent O.P.I. Publication No. 50-51324, water soluble cationic polymers disclosed in Japanese Patent O.P.I. Publication No. 55-95946, and water soluble amphoteric surfactants disclosed in Japanese Patent O.P.I. Publication No. 56-142528. Further, the examples include organic boron-containing compound to which alkylene glycol is added, disclosed in Japanese Patent O.P.I. Publication No.59-84241, polyoxyethylene-polyoxypropylene block polymer type water-soluble surfactant, disclosed in Japanese Patent O.P.I. Publication No.60-111264, an alkylenediamine compound having polyoxyethylene-polyoxypropylene, disclosed in Japanese Patent O.P.I. Publication No.60-129750, polyoxyethylene, glycol with an average weight molecular weight of not less than 300 disclosed in Japanese Patent O.P.I. Publication No.61-215554, a fluorine-containing surfactant having a cationic group disclosed in Japanese Patent O.P.I. Publication No.63-175858, and a water soluble ethyleneoxide adduct obtained by adding ethyleneoxy to an acid or an alcohol, or water soluble polyalkylenes disclosed in Japanese Patent O.P.I. Publication No.2-39157.

Organic solvents are optionally added to a developer or a developer replenisher. The organic solvent is a solvent having a solubility in water of suitably 10 weight % or less, and preferably 5 weight % or less. Examples of the organic solvent include 1-phenylethanol, 2-phenylethanol, 3-phenyl-1-propanol, 4-phenyl-1-butanol, 1-phenyl-2-butanol, 2-phonoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 3-methylcyclohexanol, 4-methylcyclohexanol, N-phenylethanolamine, and N-phenyldiethanolamine.

The organic solvent content of the working developer is preferably 0.1 to 5 weight %. It is preferred that the organic solvent content is not substantially contained in the developer or developer replenisher. The term "not substantially contained" means that the organic solvent is contained in an amount of not more than 1% by weight.

A reducing agent is optionally added to the developer or developer replenisher used in the invention. This is added in order to prevent occurrence of stains on the printing plate during printing. The addition is particularly effective in developing a negative working light sensitive planographic printing plate material comprising a light sensitive diazonium compound. Preferred examples of the reducing agent include a phenolic compound such as thiosalicylic acid, hydroquinone, metol, methoxyquinone, resorcine, or 2-methylresorcine, and an amine compound such as phenylenediamine or phenylhydrazine. Preferred examples of the inorganic reducing agent include a sodium, potassium or ammonium salt of an inorganic acid such as sodium sulfite, potassium sulfite, ammonium sulfite, sodium phosphite, potassium phosphite, ammonium phosphite, sodium hydrogen phosphite, potassium hydrogen phosphite, ammonium hydrogen phosphite, sodium thiosulfate, potassium thiosulfate, ammonium thiosulfate, sodium dithionite, potassium dithionite, ammonium dithionite. It is sulfite of these that shows excellent anti-staining effect. The reducing agent content of the developer is preferably 0.05 to 5% by weight.

An organic carboxylic acid is optionally added to the developer or developer replenisher used in the invention. Preferred organic carboxylic acids include an aliphatic carboxylic acid or an aromatic carboxylic acid each having a carbon atom number of from 6 to 20.

Examples of the aliphatic carboxylic acid include caproic acid, enanthic acid, caprylic acid, lauric acid, myristic acid, palmitic acid, and stearic acid. Particularly preferred are alkanoic acids having a carbon atom number of from 8 to 12. The acid may be an unsaturated acid having a double bond in the molecule or may have a branched carbon chain. The aromatic carboxylic acid is an aromatic compound such as benzene, naphthalene or anthracene having a carboxyl group.

Examples of the aromatic carboxylic acid include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Hydroxy naphthoic acids are especially preferred.

These carboxylic acids are preferably used in the salt form, for example as the sodium salts, potassium salts or ammonium salts, in order to increase the water solubility. The carboxylic acid content of the developer is not specifically limited, but the carboxylic acid content less than 0.1% by weight does not show sufficient effect and the carboxylic acid content more than 10% by weight does not show more improved effect, and may prevent dissolution of another additive in the developer. The carboxylic acid content of the developer is preferably from 0.1 to 10% by weight, and more preferably from 0.5 to 4% by weight.

The developer or developer replenisher in the invention may contain the following additives in order to increase development performance. Examples of the additives include a neutral salt such as sodium chloride, potassium chloride, potassium bromide, as dislosed in Japanese Patent O.P.I. Publication No. 58-75152, a complex such as [Co (NH$_x$)$_6$]Cl$_3$ as dislosed in Japanese Patent O.P.I. Publication No. 59-121336, an amphoteric polymer such as a copolymer of vinylbenzyltrimethylammonium chloride and sodium acrylate as disclosed in Japanese Patent O.P.I. Publication No. 56-142258, the organic metal containing surfactant containing Si or Ti as disclosed in Japanese Patent O.P.I. Publication No. 59-75255, and the organic boron containing compound disclosed in Japanese Patent O.P.I. Publication No. 59-84241.

The developer or developer replenisher in the invention can further contain an antiseptic agent, a coloring agent, a viscosity increasing agent, an antifoaming agent, or a water softener. Examples of the antifoaming agent include mineral oil, vegetable oil, alcohols, surfactants, and silicon oil. The water softeners include polyphosphoric acid or its sodium, potassium or ammonium salt; aminopolycarboxylic acids or their salts such as ethylenediaminetetraacetic acid or its sodium, potassium or ammonium salt, diethylenetriaminepentaacetic acid or its sodium, potassium or ammonium salt, triethylenetetramine-hexaacetic acid or its sodium, potassium or ammonium salt, hydroxyethylethylene-diaminetriacetic acid or its sodium, potassium or ammonium salt, nitrilotriacetic acid or its sodium, potassium or ammonium salt, 1,2-diaminocyclohexane-tetraacetic acid or its sodium, potassium or ammonium salt, 1,3-diamino-2-propanoltetraacetic acid or its sodium, potassium or ammonium salt; and phosphonic acids or their salts such as aminotri(methylenephosphonic acid) or its sodium, potassium or ammonium salt, ethylenediaminetetra(methylenephosphonic acid) or its sodium, potassium or ammonium salt, diethylenetriamine-penta(methylenephosphonic acid) or its sodium, potassium or ammonium salt, triethylenetetraminehexa(methylenephosphonic acid) or its sodium, potassium or ammonium salt, hydroxyethylethylenediaminetri(methylenephosphonic acid) or its sodium, potassium or ammonium salt, and 1-hydroxyethane-1,1-diphosphonic acid or its sodium, potassium or ammonium salt.

The water softener content of the developer varies on hardness or amount of a hard water used, but the content is preferably 0.01 to 5 weight %, and more preferably 0.01 to 0.5 weight %. The water softener content less than 0.01% by weight cannot obtain a desired object, while the water softener content less than 5% by weight provides an adverse effect on image portions, such as color elimination. The developer or developer replenisher is an aqueous solution in which water is used as a solvent. The electric conductance of the developer is preferably from 5 to 50 mS.

The light sensitive planographic printing plate material developed with the developer described above is subjected to post-processing. The post-processing step comprises post-processing the developed plate material with a post-processing solution such as washing water, a rinsing solution containing a surfactant, a finisher or a protective gumming solution containing gum arabic or starch derivatives as a main component. The post-processing step is carried out employing an appropriate combination of the post-processing solution described above. For example, a method is preferred in which a developed planographic printing plate material is post-washed with washing water, and then processed with a rinsing solution containing a surfactant, or a developed planographic printing plate material is post-washed with washing water, and then processed with a finisher, since it reduces fatigue of the rinsing solution or the finisher. It is preferred that a multi-step countercurrent processing is carried out employing a rinsing solution or a finisher.

The post-processing is carried out employing an automatic developing machine having a development section and a post-processing section. In the post-processing step, the developed printing plate is sprayed with the post-processing solution from a spray nozzle or is immersed into the post-processing solution in a post-processing tank. A method is known in which supplies a small amount of water onto the developed printing plate material to wash the material, and reuses the water used for washing as a dilution water of a concentrated developer. In the automatic developing machine, a method is applied in which each processing solution is replenished with the respective processing replenisher according to the area of the printing plate material to have been processed or the operating time of the machine. A method (use-and-discard method) can be applied in which the developed material is processed with fresh processing solution and discarded. The thus obtained planographic printing plate is mounted on a printing press, and printing is carried out.

EXAMPLES

Next, the present invention will be explained in the following examples, but the present invention is not limited thereto. In the examples, "parts" represents "parts by weight", unless otherwise specified.

Example 1

Synthesis of Polymer Binder (Synthesis of Acryl Copolymer 1)

Thirty parts of methacrylic acid, 50 parts of methyl methacrylate, 20 parts of ethyl methacrylate, 500 parts of isopropyl alcohol, and 3 parts of α,α-azobisisobutyro-nitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylammonium chloride and 25 parts of glycidyl methacrylate were further added to the mixture, and reacted for additional 3 hours. Thus, acryl copolymer 1 (20% isopropyl alcohol solution) was obtained. The weight average molecular weight of the acryl copolymer 1 was 35,000, measured according to GPC. The glass transition temperature Tg of the acryl copolymer 1 was 85° C., measured according to DSC (differential thermal analysis). The acryl copolymer 1 had an acid value of 80, and a reactive group-containing unit of 18 mol %.

(Preparation of Support)

A 0.3 mm thick aluminum plate (material 1050, quality H16) was degreased at 60° C. for one minute in a 5% sodium hydroxide solution, washed with water, immersed at 25° C. for one minute in a 10% hydrochloric acid solution to neutralize, and then washed with water. The resulting aluminum plate was electrochemically etched using an alternating current at 25° C for 60 seconds at a current density of 100 A/dm$^2$ in a 10 g/liter hydrochloric acid solution, and desmutted at 60° C. for 10 seconds in a 5% sodium hydroxide solution. The desmutted aluminum plate was anodized at 25° C. for 1 minute at a current density of 10 A/dm$^2$ and at a voltage of 15 V in a 15% sulfuric acid solution, immersed in a 1% polyvinyl phosphonic acid aqueous solution at 75° C. for 30 seconds, washed with water, and dried. Thus, support was obtained. The center line average surface roughness (Ra) of the support was 0.8 μm.

(Preparation of Light Sensitive Planographic Printing Plate Material)

The following photopolymerizable light sensitive layer coating solution 1 was coated on the resulting support through a wire bar, and dried at 95° C. for 1.5 minutes to give a light sensitive layer having a dry thickness of 1.5 g/m$^2$.

| (Photopolymerizable light sensitive layer coating solution 1) | |
|---|---|
| Compound of formula 1 or 2 (as shown in Tables 1, 3 and 5) | amount shown in Tables 1, 3 and 5 |
| Photopolymerization initiator (as shown in Tables 1, 3 and 5) | amount shown in Tables 1, 3 and 5 |
| Spectral sensitizing dye (as shown in Tables 1, 3 and 5) | amount shown in Tables 1, 3 and 5 |
| Addition polymerizable ethylenically unsaturated monomer (as shown in Tables 1, 3 and 5) | amount shown in Tables 1, 3 and 5 |
| Acryl copolymer 1 | 40.0 parts |
| N-Phenylglycine benzyl ester | 4.0 parts |
| Phthalocyanine pigment (MHI #454 produced by Mikuni Sikisosha) | 6.0 parts |
| Polymerization inhibitor (Sanol LS-770 produced by Sankyo Co., Ltd.) | 0.5 parts |
| Fluorine-contained surfactant (Megafac F-178K produced by Dainippon Ink Kagaku Kogyo Co., Ltd.) | 0.5 parts |
| Cyclohexanone | 700 parts |
| Methyl ethyl ketone | 200 parts |

After that, the following oxygen shielding layer coating solution 1 was coated on the photopolymerizable light sensitive layer using an applicator, and dried at 75° C. for 1.5 minutes to give an oxygen shielding layer with a dry thickness of 1.8 g/m$^2$. Thus, light sensitive planographic printing plate material samples 1 through 45 were prepared.

| (Oxygen shielding layer coating solution 1) | |
|---|---|
| Polyvinyl alcohol (GL-05, produced by Nippon Gosei Kagaku Co., Ltd.) | 99.5 parts |
| Surfactant (Surfinol 465, produced by Nisshin Kagaku Kogyo Co., Ltd.) | 0.5 parts |
| Water | 900 parts |

Evaluation of Light Sensitive Planographic Printing Plate Material Sample (Sensitivity)

The light sensitive planographic printing plate material sample obtained above was imagewise exposed at a resolving degree of 2400 dpi, employing a plate setter Tiger Cat (produced by ECRM Co., Ltd.) in which a light source emitting a 532 nm light was installed. Herein, dpi represents the dot numbers per 2.54 cm. The image pattern used for the exposure comprised a solid image and a square dot image with a screen number of 175 LPI and a 50% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample at 100° C. for 10 seconds, a pre-washing section for removing the oxygen shielding layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, a planographic printing plate was obtained. The lowest exposure energy amount (uJ/cm$^2$) reproducing the solid image above in the resulting planographic printing plate with no reduction of the layer thickness at the solid image portions was defined as sensitivity. The less the lowest exposure energy amount (μJ/cm$^2$) is, the higher the sensitivity. The results are shown in Tables 2, 4 and 6.

| <Developer composition> | |
|---|---|
| Potassium silicate solution (containing 26% by weight of SiO$_2$ and 13.5% by weight of K$_2$O) | 40.0 g/liter |
| Potassium hydroxide | 4.0 g/liter |
| Ethylenediaminetetraacetic acid | 0.5 g/liter |
| 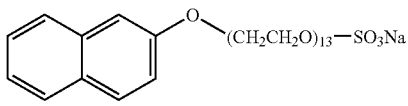 | 20.0 g/liter |
| Water | amount giving a pH of 12.3 |

(Printing Durability)

The light sensitive planographic printing plate material sample was imagewise exposed at 200 μJ/Cm$^2$ to give a 175 lines/inch image, and developed to obtain a planographic printing plate. Employing the resulting printing plate, printing was carried out on a press (DAIYA1F-1 produced by Mitsubishi Jukogyo Co., Ltd.), wherein a coat paper, printing ink (soybean oil-based ink "Naturalist 100" produced by Dainippon Ink Kagaku Kogyo Co., Ltd.), and dampening water (SG-51, H solution produced by Tokyo Ink Co., Ltd., Concentration: 1.5%) were used. The number of prints printed from the beginning of the printing till when dot reduction at highlight image portions was observed was evaluated as a measure of printing durability.

(Small Dot Reproduction)

The light sensitive planographic printing plate material sample was imagewise exposed at 200 μJ/cm$^2$ to give images of a dot area from 1 to 10% (at an interval of 1%) at a screen frequency of 175 lines, and developed to obtain a planographic printing plate. Employing the resulting printing plate, printing was carried out in the same manner as above. The smallest dot reproduced on the prints was evaluated as a measure of small dot reproduction.

(Storage Stability)

An interleaf was superposed on the coated layer of the light sensitive planographic printing plate material sample obtained above and packaged in a light shielding black paper package. The resulting package was stored at 55° C. (at humidity of not more than 30% RH) for 3 days. Thereafter, the resulting sample was processed in the same manner as in the evaluation of sensitivity above to obtain a printing plate. The printing plate was inked with development ink PI-2 (produced by Fuji Photo Film Co., Ltd.), in which the plate was rubbed with a PS sponge impregnated with PI-2, washed with water, and dried. Thereafter, inking at non-image portions of the resulting printing plate was observed through a magnifying glass. The storage stability was evaluated according to the following criteria:

A: No inking was observed
B: Inking was observed at a part of the non-image portions.
C: Inking was observed at the entire non-image portions.

(Sludge)

The light sensitive planographic printing plate material sample was imagewise exposed through a light source used above to give an area ratio of image portions to non-image portions of 1:9. The exposed sample of 400 m$^2$ were processed employing the above automatic developing machine obtained above, while a developer replenisher was replenished in the developer tank at a rate of 100 ml/m$^2$. After processing, sludge produced in the developer tank and the amount of the sludge were evaluated according to the following criteria:

A: Only slight sludge was observed in the developer tank, however, no sludge was observed on the transporting roller.
B: Sludge was observed both in the developer tank and on the transporting roller, however, the sludge was not transferred to the printing plate to have been processed.
C: Sludge was observed in the developer tank, on the transporting roller, and on the printing plate to have been processed.

After the processing, 100 ml of the developer was stored at 40° C. for 2 weeks. The resulting precipitate was filtered off with a filter paper No. 2 (produced by ADVANTEC Co., Ltd.), and dried. The dried precipitate was weighed as the amount of the sludge.

"NK Oligo U-4HA" represents urethane acrylate oligomer produced by Shinnakamura Kogyo Co., Ltd.

"NK Ester 4G" represents polyethylene glycol dimethacrylate produced by Shinnakamura Kogyo Co., Ltd.

TABLE 1

| Sample No. | Compound of formula 1 or 2 (parts) | Photo-polymerization initiator (parts) | Spectral sensitizing dye (parts) | Monomer (parts) |
|---|---|---|---|---|
| 1 | H-1 (3.0) | I-1 (6.0) | D-1 (4.0) | M-1 (25) NK Ester 4G (15) |
| 2 | H-1 (3.0) | I-1 (6.0) | D-1 (4.0) | M-2 (25) NK Ester 4G (15) |
| 3 | H-1 (3.0) | I-1 (6.0) | D-1 (4.0) | M-3 (25) NK Ester 4G (15) |
| 4 | H-1 (3.0) | I-1 (6.0) | D-1 (4.0) | M-4 (25) NK Ester 4G (15) |
| 5 | H-1 (3.0) | I-1 (6.0) | D-1 (4.0) | M-5 (25) NK Ester 4G (15) |
| 6 | H-2 (3.0) | I-1 (6.0) | D-2 (4.0) | M-1 (25) NK Ester 4G (15) |
| 7 | H-2 (3.0) | I-1 (6.0) | D-2 (4.0) | M-2 (25) NK Ester 4G (15) |
| 8 | H-2 (3.0) | I-1 (6.0) | D-2 (4.0) | M-3 (25) NK Ester 4G (15) |
| 9 | H-2 (3.0) | I-1 (6.0) | D-2 (4.0) | M-4 (25) NK Ester 4G (15) |
| 10 | H-2 (3.0) | I-1 (6.0) | D-2 (4.0) | M-5 (25) NK Ester 4G (15) |
| 11 | H-1 (3.0) | I-2 (6.0) | D-1 (4.0) | M-1 (25) NK Ester 4G (15) |
| 12 | H-1 (3.0) | I-2 (6.0) | D-1 (4.0) | M-2 (25) NK Ester 4G (15) |
| 13 | H-1 (3.0) | I-2 (6.0) | D-1 (4.0) | M-3 (25) NK Ester 4G (15) |
| 14 | H-1 (3.0) | I-2 (6.0) | D-1 (4.0) | M-4 (25) NK Ester 4G (15) |
| 15 | H-1 (3.0) | I-2 (6.0) | D-1 (4.0) | M-5 (25) NK Ester 4G (15) |
| 16 | H-2 (3.0) | I-2 (6.0) | D-2 (4.0) | M-1 (25) NK Ester 4G (15) |

TABLE 2

| Sample No. | Sensitivity (µJ/cm²) | Printing durability (Sheet number) | Small dot reproduction (%) | Storage stability Sensitivity (µJ/cm²) | Stain | Sludge Sludge produced | Amount of sludge (mg) | Remarks |
|---|---|---|---|---|---|---|---|---|
| 1 | 70 | 200,000 | 3 | 75 | A | A | 600 | Inv. |
| 2 | 60 | 210,000 | 3 | 65 | A | A | 550 | Inv. |
| 3 | 50 | 220,000 | 3 | 55 | A | A | 500 | Inv. |
| 4 | 55 | 180,000 | 3 | 60 | A | A | 540 | Inv. |
| 5 | 65 | 200,000 | 3 | 70 | A | A | 580 | Inv. |
| 6 | 70 | 205,000 | 3 | 75 | A | A | 500 | Inv. |
| 7 | 60 | 190,000 | 3 | 65 | A | A | 510 | Inv. |
| 8 | 50 | 210,000 | 3 | 55 | A | A | 530 | Inv. |
| 9 | 55 | 185,000 | 3 | 60 | A | A | 500 | Inv. |
| 10 | 65 | 195,000 | 3 | 70 | A | A | 570 | Inv. |
| 11 | 55 | 205,000 | 3 | 60 | A | A | 600 | Inv. |
| 12 | 50 | 210,000 | 3 | 55 | A | A | 560 | Inv. |
| 13 | 45 | 220,000 | 3 | 50 | A | A | 580 | Inv. |
| 14 | 50 | 200,000 | 3 | 55 | A | A | 520 | Inv. |
| 15 | 60 | 195,000 | 3 | 65 | A | A | 590 | Inv. |
| 16 | 55 | 198,000 | 3 | 60 | A | A | 610 | Inv. |

Inv.: Inventive

TABLE 3

| Sample No. | Compound of formula 1 or 2 (parts) | Photo-polymerization initiator (parts) | Spectral sensitizing dye (parts) | Monomer (parts) |
|---|---|---|---|---|
| 17 | H-2 (3.0) | I-2 (6.0) | D-2 (4.0) | M-2 (25) NK Ester 4G (15) |
| 18 | H-2 (3.0) | I-2 (6.0) | D-2 (4.0) | M-3 (25) NK Ester 4G (15) |
| 19 | H-2 (3.0) | I-2 (6.0) | D-2 (4.0) | M-4 (25) NK Ester 4G (15) |
| 20 | H-2 (3.0) | I-2 (6.0) | D-2 (4.0) | M-5 (25) NK Ester 4G (15) |
| 21 | H-1 (3.0) | I-3 (6.0) | D-3 (4.0) | M-1 (25) NK Ester 4G (15) |
| 22 | H-1 (3.0) | I-3 (6.0) | D-3 (4.0) | M-2 (25) NK Ester 4G (15) |
| 23 | H-1 (3.0) | I-3 (6.0) | D-3 (4.0) | M-3 (25) NK Ester 4G (15) |
| 24 | H-1 (3.0) | I-3 (6.0) | D-3 (4.0) | M-4 (25) NK Ester 4G (15) |
| 25 | H-1 (3.0) | I-3 (6.0) | D-3 (4.0) | M-5 (25) NK Ester 4G (15) |
| 26 | H-2 (3.0) | I-4 (6.0) | D-4 (4.0) | M-1 (25) NK Ester 4G (15) |
| 27 | H-2 (3.0) | I-4 (6.0) | D-4 (4.0) | M-2 (25) NK Ester 4G (15) |
| 28 | H-2 (3.0) | I-4 (6.0) | D-4 (4.0) | M-3 (25) NK Ester 4G (15) |
| 29 | H-2 (3.0) | I-4 (6.0) | D-4 (4.0) | M-4 (25) NK Ester 4G (15) |
| 30 | H-2 (3.0) | I-4 (6.0) | D-4 (4.0) | M-5 (25) NK Ester 4G (15) |

TABLE 4

| Sample No. | Sensitivity (µJ/cm²) | Printing durability (Sheet number) | Small dot reproduction (%) | Storage stability Sensitivity (µJ/cm²) | Stain | Sludge Sludge produced | Amount of sludge (mg) | Remarks |
|---|---|---|---|---|---|---|---|---|
| 17 | 50 | 203,000 | 3 | 55 | A | A | 600 | Inv. |
| 18 | 45 | 210,000 | 3 | 50 | A | A | 510 | Inv. |
| 19 | 50 | 212,000 | 3 | 55 | A | A | 580 | Inv. |
| 20 | 60 | 218,000 | 3 | 65 | A | A | 570 | Inv. |
| 21 | 75 | 198,000 | 3 | 80 | A | A | 560 | Inv. |
| 22 | 75 | 196,000 | 3 | 80 | A | A | 600 | Inv. |
| 23 | 60 | 206,000 | 3 | 65 | A | A | 510 | Inv. |

TABLE 4-continued

| Sample No. | Sensitivity ($\mu J/cm^2$) | Printing durability (Sheet number) | Small dot reproduction (%) | Storage stability Sensitivity ($\mu J/cm^2$) | Stain | Sludge produced | Amount of sludge (mg) | Remarks |
|---|---|---|---|---|---|---|---|---|
| 24 | 65 | 216,000 | 3 | 70 | A | A | 550 | Inv. |
| 25 | 70 | 217,000 | 3 | 75 | A | A | 600 | Inv. |
| 26 | 75 | 209,000 | 3 | 80 | A | A | 520 | Inv. |
| 27 | 75 | 205,000 | 3 | 80 | A | A | 600 | Inv. |
| 28 | 60 | 212,000 | 3 | 65 | A | A | 530 | Inv. |
| 29 | 65 | 208,000 | 3 | 70 | A | A | 550 | Inv. |
| 30 | 70 | 200,000 | 3 | 75 | A | A | 500 | Inv. |

Inv.: Inventive

TABLE 5

| Sample No. | Compound of formula 1 or 2 (parts) | Photo-polymerization initiator (parts) | Spectral sensitizing dye (parts) | Monomer (parts) |
|---|---|---|---|---|
| 31 | H-15 (3.0) | I-1 (6.0) | D-1 (4.0) | M-3 (25) NK Ester 4G (15) |
| 32 | H-16 (3.0) | I-1 (6.0) | D-1 (4.0) | M-3 (25) NK Ester 4G (15) |
| 33 | H-40 (3.0) | I-1 (6.0) | D-1 (4.0) | M-3 (25) NK Ester 4G (15) |
| 34 | H-46 (3.0) | I-1 (6.0) | D-1 (4.0) | M-3 (25) NK Ester 4G (15) |
| 35 | H-15 (3.0) | I-3 (6.0) | D-3 (4.0) | M-3 (25) NK Ester 4G (15) |
| 36 | H-16 (3.0) | I-3 (6.0) | D-3 (4.0) | M-3 (25) NK Ester 4G (15) |
| 37 | H-40 (3.0) | I-3 (6.0) | D-3 (4.0) | M-3 (25) NK Ester 4G (15) |
| 38 | H-46 (3.0) | I-3 (6.0) | D-3 (4.0) | M-3 (25) NK Ester 4G (15) |
| 39 | H-15 (3.0) | I-4 (6.0) | D-4 (4.0) | M-3 (25) NK Ester 4G (15) |
| 40 | H-16 (3.0) | I-4 (6.0) | D-4 (4.0) | M-3 (25) NK Ester 4G (15) |
| 41 | H-40 (3.0) | I-4 (6.0) | D-4 (4.0) | M-3 (25) NK Ester 4G (15) |
| 42 | H-46 (3.0) | I-4 (6.0) | D-4 (4.0) | M-3 (25) NK Ester 4G (15) |
| 43 | None | I-1 (6.0) | D-1 (4.0) | M-3 (25) NK Ester 4G (15) |
| 44 | Comparative compound 1 | I-1 (6.0) | D-1 (4.0) | M-3 (25) NK Ester 4G (15) |
| 45 | Comparative compound 2 | I-1 (6.0) | D-1 (4.0) | M-3 (25) NK Ester 4G (15) |

TABLE 6

| Sample No. | Sensitivity ($\mu J/cm^2$) | Printing durability (Sheet number) | Small dot reproduction (%) | Storage stability Sensitivity ($\mu J/cm^2$) | Stain | Sludge produced | Amount of sludge (mg) | Remarks |
|---|---|---|---|---|---|---|---|---|
| 31 | 35 | 400,000 | 3 | 35 | A | A | 490 | Inv. |
| 32 | 25 | 400,000 | 3 | 28 | A | A | 485 | Inv. |
| 33 | 40 | 400,000 | 3 | 44 | A | A | 490 | Inv. |
| 34 | 40 | 400,000 | 3 | 44 | A | A | 490 | Inv. |
| 35 | 45 | 350,000 | 3 | 43 | A | A | 350 | Inv. |
| 36 | 33 | 400,000 | 3 | 30 | A | A | 333 | Inv. |
| 37 | 47 | 300,000 | 3 | 45 | A | A | 370 | Inv. |
| 38 | 48 | 300,000 | 3 | 45 | A | A | 370 | Inv. |
| 39 | 55 | 250,000 | 3 | 60 | A | A | 525 | Inv. |
| 40 | 40 | 400,000 | 3 | 45 | A | A | 520 | Inv. |

TABLE 6-continued
| Sample No. | Printing durability Sensitivity (μJ/cm²) | (Sheet number) | Small dot reproduction (%) | Storage stability Sensitivity (μJ/cm²) | Stain | Sludge Sludge produced | Amount of sludge (mg) | Remarks |
|---|---|---|---|---|---|---|---|---|
| 41 | 60 | 200,000 | 3 | 65 | A | A | 525 | Inv. |
| 42 | 60 | 200,000 | 3 | 65 | A | A | 525 | Inv. |
| 43 | 200 | 5,000 | 20 | 300 | B | A | 500 | Comp. |
| 44 | 75 | 100,000 | 7 | 90 | B | C | 1000 | Comp. |
| 45 | 100 | 40,000 | 10 | 200 | B | C | 1000 | Comp. |
Inv.; Inventive
Comp.; Comparative
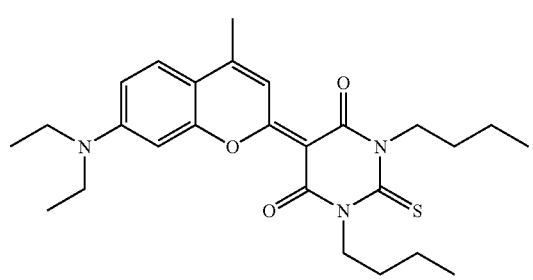
(λ max: 508 nm)  D-1
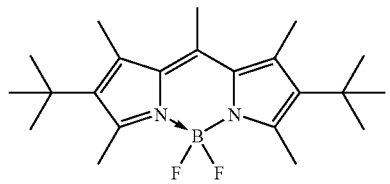
(λ max: 521 nm)  D-2
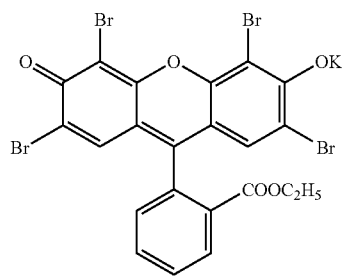
(λ max: 538 nm)  D-3
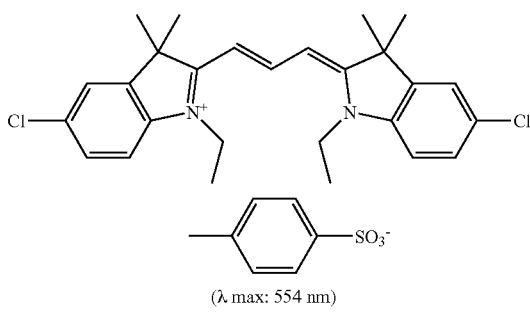
(λ max: 554 nm)  D-4
-continued
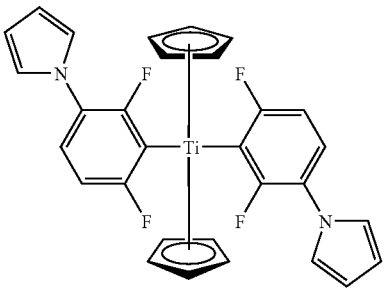
I-1
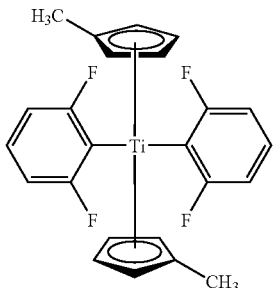
I-2
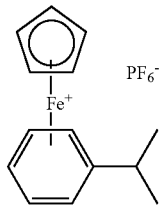
I-3
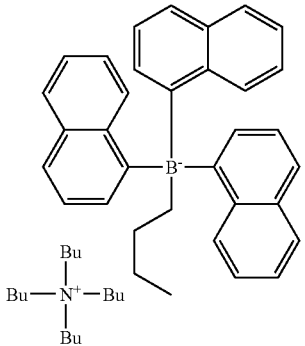
I-4

-continued

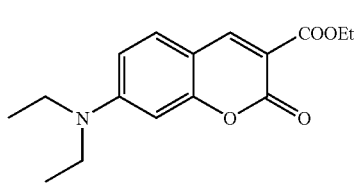

D-8

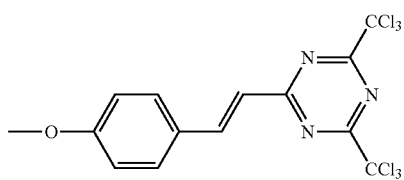

Comparative compound 1

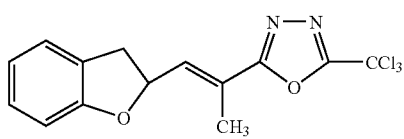

Comparative compound 2

As is apparent from Tables 1 through 6, the inventive samples 1 through 42 provide excellent small dot reproduction, excellent storage stability, reduced sludge as well as high sensitivity and high printing durability, as compared with comparative samples 43, 44 and 45.

Example 2

Light sensitive planographic printing plate material samples 43 through 106 were prepared in the same manner as in Example 1, except that the following photopolymerizable light sensitive layer coating solution 2 was used instead of the photopolymerizable light sensitive layer coating solution 1.

| (Photopolymerizable light sensitive layer coating solution 2) | |
|---|---|
| Compound of formula 1 or 2 (as shown in Tables 7, 9 and 11) | amount shown in Tables 7, 9 and 11 |
| Photopolymerization initiator (as shown in Tables 7, 9 and 11) | amount shown in Tables 7, 9 and 11 |
| Spectral sensitizing dye (as shown in Tables 7, 9 and 11) | amount shown in Tables 7, 9 and 11 |
| Addition polymerizable ethylenically unsaturated monomer (as shown in Tables 7, 9 and 11) | amount shown in Tables 7, 9 and 11 |
| Acryl copolymer 1 | 40.0 parts |
| N-Phenylglycine benzyl ester | 4.0 parts |
| Phthalocyanine pigment (MHI #454 produced by Mikuni Sikisosha) | 6.0 parts |
| Polymerization inhibitor (Sanol LS-770 produced by Sankyo Co., Ltd.) | 0.5 parts |
| Fluorine-contained surfactant (Megafac F-178K produced by Dainippon Ink Kagaku Kogyo Co., Ltd.) | 0.5 parts |
| Propylene glycol monomethyl ether | 700 parts |
| Methyl ethyl ketone | 200 parts |

Evaluation of Light Sensitive Planographic Printing Plate Material Sample

The light sensitive planographic printing plate material sample obtained above was processed in the same manner as in Example 1, except that the light source in the plate setter Tiger Cat (produced by ECRM Co., Ltd.) was replaced with a 30 mW light source emitting a 408 nm light, and evaluated in the same manner as in Example 1. The results are shown in Tables 8, 10 and 12.

"NK Oligo U-4HA" represents urethane urethane acrylate oligomer produced by Shinnakamura Kogyo Co., Ltd.

"NK Ester 4G" represents polyethylene glycol dimethacrylate produced by Shinnakamura Kogyo Co., Ltd.

TABLE 7

| Sample No. | Compound of formula 1 or 2 (parts) | Photo-polymerization initiator (parts) | Spectral sensitizing dye (parts) | Monomer (parts) |
|---|---|---|---|---|
| 46 | H-1 (3.0) | I-1 (6.0) | D-5 (4.0) | M-1 (25) NK Ester 4G (15) |
| 47 | H-1 (3.0) | I-1 (6.0) | D-5 (4.0) | M-2 (25) NK Ester 4G (15) |
| 48 | H-1 (3.0) | I-1 (6.0) | D-5 (4.0) | M-3 (25) NK Ester 4G (15) |
| 49 | H-1 (3.0) | I-1 (6.0) | D-5 (4.0) | M-4 (25) NK Ester 4G (15) |
| 50 | H-1 (3.0) | I-1 (6.0) | D-5 (4.0) | M-5 (25) NK Ester 4G (15) |
| 51 | H-1 (3.0) | I-1 (6.0) | D-6 (4.0) | M-1 (25) NK Ester 4G (15) |
| 52 | H-1 (3.0) | I-1 (6.0) | D-6 (4.0) | M-2 (25) NK Ester 4G (15) |
| 53 | H-1 (3.0) | I-1 (6.0) | D-6 (4.0) | M-3 (25) NK Ester 4G (15) |
| 54 | H-1 (3.0) | I-1 (6.0) | D-6 (4.0) | M-4 (25) NK Ester 4G (15) |
| 55 | H-1 (3.0) | I-1 (6.0) | D-6 (4.0) | M-5 (25) NK Ester 4G (15) |
| 56 | H-2 (3.0) | I-1 (6.0) | D-7 (4.0) | M-1 (25) NK Ester 4G (15) |
| 57 | H-2 (3.0) | I-1 (6.0) | D-7 (4.0) | M-2 (25) NK Ester 4G (15) |
| 58 | H-2 (3.0) | I-1 (6.0) | D-7 (4.0) | M-3 (25) NK Ester 4G (15) |
| 59 | H-2 (3.0) | I-1 (6.0) | D-7 (4.0) | M-4 (25) NK Ester 4G (15) |
| 60 | H-2 (3.0) | I-1 (6.0) | D-7 (4.0) | M-5 (25) NK Ester 4G (15) |
| 61 | H-2 (3.0) | I-2 (6.0) | D-5 (4.0) | M-1 (25) NK Ester 4G (15) |
| 62 | H-2 (3.0) | I-2 (6.0) | D-5 (4.0) | M-2 (25) NK Ester 4G (15) |
| 63 | H-2 (3.0) | I-2 (6.0) | D-5 (4.0) | M-3 (25) NK Ester 4G (15) |
| 64 | H-2 (3.0) | I-2 (6.0) | D-5 (4.0) | M-4 (25) NK Ester 4G (15) |
| 65 | H-2 (3.0) | I-2 (6.0) | D-5 (4.0) | M-5 (25) NK Ester 4G (15) |

TABLE 8

| Sample No. | Sensitivity (μJ/cm²) | Printing durability (Sheet number) | Small dot reproduction (%) | Storage stability Sensitivity (μJ/cm²) | Stain | Sludge produced | Amount of sludge (mg) | Remarks |
|---|---|---|---|---|---|---|---|---|
| 46 | 50 | 210,000 | 2 | 55 | A | A | 550 | Inv. |
| 47 | 40 | 190,000 | 3 | 45 | A | A | 590 | Inv. |
| 48 | 35 | 195,000 | 2 | 40 | A | A | 550 | Inv. |
| 49 | 40 | 200,000 | 3 | 45 | A | A | 540 | Inv. |
| 50 | 45 | 205,000 | 3 | 50 | A | A | 580 | Inv. |
| 51 | 50 | 200,000 | 3 | 55 | A | A | 570 | Inv. |
| 52 | 50 | 188,000 | 2 | 55 | A | A | 560 | Inv. |
| 53 | 45 | 192,000 | 2 | 50 | A | A | 510 | Inv. |
| 54 | 55 | 196,000 | 3 | 60 | A | A | 530 | Inv. |
| 55 | 45 | 187,000 | 2 | 50 | A | A | 550 | Inv. |
| 56 | 40 | 203,000 | 3 | 45 | A | A | 540 | Inv. |
| 57 | 50 | 205,000 | 2 | 55 | A | A | 550 | Inv. |
| 58 | 55 | 209,000 | 3 | 60 | A | A | 550 | Inv. |
| 59 | 45 | 207,000 | 3 | 50 | A | A | 560 | Inv. |
| 60 | 40 | 199,000 | 3 | 45 | A | A | 580 | Inv. |
| 61 | 55 | 200,000 | 3 | 60 | A | A | 520 | Inv. |
| 62 | 60 | 210,000 | 3 | 65 | A | A | 550 | Inv. |
| 63 | 55 | 220,000 | 3 | 60 | A | A | 520 | Inv. |
| 64 | 50 | 180,000 | 2 | 55 | A | A | 510 | Inv. |
| 65 | 55 | 200,000 | 2 | 60 | A | A | 560 | Inv. |

TABLE 9

| Sample No. | Compound of formula 1 or 2 (parts) | Photo-polymerization initiator (parts) | Spectral sensitizing dye (parts) | Monomer (parts) |
|---|---|---|---|---|
| 66 | H-1 (3.0) | I-2 (6.0) | D-6 (4.0) | M-1 (25) NK Ester 4G (15) |
| 67 | H-1 (3.0) | I-2 (6.0) | D-6 (4.0) | M-2 (25) NK Ester 4G (15) |
| 68 | H-1 (3.0) | I-2 (6.0) | D-6 (4.0) | M-3 (25) NK Ester 4G (15) |
| 69 | H-1 (3.0) | I-2 (6.0) | D-6 (4.0) | M-4 (25) NK Ester 4G (15) |
| 70 | H-1 (3.0) | I-2 (6.0) | D-6 (4.0) | M-5 (25) NK Ester 4G (15) |
| 71 | H-1 (3.0) | I-2 (6.0) | D-7 (4.0) | M-1 (25) NK Ester 4G (15) |
| 72 | H-1 (3.0) | I-2 (6.0) | D-7 (4.0) | M-2 (25) NK Ester 4G (15) |
| 73 | H-1 (3.0) | I-2 (6.0) | D-7 (4.0) | M-3 (25) NK Ester 4G (15) |
| 74 | H-1 (3.0) | I-2 (6.0) | D-7 (4.0) | M-4 (25) NK Ester 4G (15) |
| 75 | H-1 (3.0) | I-2 (6.0) | D-7 (4.0) | M-5 (25) NK Ester 4G (15) |
| 76 | H-2 (3.0) | I-3 (6.0) | D-5 (4.0) | M-1 (25) NK Ester 4G (15) |
| 77 | H-2 (3.0) | I-3 (6.0) | D-5 (4.0) | M-2 (25) NK Ester 4G (15) |
| 78 | H-2 (3.0) | I-3 (6.0) | D-5 (4.0) | M-3 (25) NK Ester 4G (15) |
| 79 | H-2 (3.0) | I-3 (6.0) | D-5 (4.0) | M-4 (25) NK Ester 4G (15) |
| 80 | H-2 (3.0) | I-3 (6.0) | D-5 (4.0) | M-5 (25) NK Ester 4G (15) |
| 81 | H-2 (3.0) | I-3 (6.0) | D-6 (4.0) | M-1 (25) NK Ester 4G (15) |
| 82 | H-2 (3.0) | I-3 (6.0) | D-6 (4.0) | M-2 (25) NK Ester 4G (15) |
| 83 | H-2 (3.0) | I-3 (6.0) | D-6 (4.0) | M-3 (25) NK Ester 4G (15) |
| 84 | H-2 (3.0) | I-3 (6.0) | D-6 (4.0) | M-4 (25) NK Ester 4G (15) |
| 85 | H-2 (3.0) | I-3 (6.0) | D-6 (4.0) | M-5 (25) NK Ester 4G (15) |
| 86 | H-1 (3.0) | I-3 (6.0) | D-7 (4.0) | M-1 (25) NK Ester 4G (15) |
| 87 | H-1 (3.0) | I-3 (6.0) | D-7 (4.0) | M-2 (25) NK Ester 4G (15) |
| 88 | H-1 (3.0) | I-3 (6.0) | D-7 (4.0) | M-3 (25) NK Ester 4G (15) |
| 89 | H-1 (3.0) | I-3 (6.0) | D-7 (4.0) | M-4 (25) NK Ester 4G (15) |
| 90 | H-1 (3.0) | I-3 (6.0) | D-7 (4.0) | M-5 (25) NK Ester 4G (15) |

TABLE 10

| Sample No. | Sensitivity (μJ/cm²) | Printing durability (Sheet number) | Small dot reproduction (%) | Storage stability Sensitivity (μJ/cm²) | Stain | Sludge produced | Amount of sludge (mg) | Remarks |
|---|---|---|---|---|---|---|---|---|
| 66 | 50 | 205,000 | 2 | 55 | A | A | 500 | Inv. |
| 67 | 45 | 190,000 | 3 | 50 | A | A | 520 | Inv. |
| 68 | 40 | 210,000 | 3 | 45 | A | A | 570 | Inv. |
| 69 | 45 | 185,000 | 3 | 50 | A | A | 510 | Inv. |
| 70 | 45 | 195,000 | 3 | 50 | A | A | 540 | Inv. |
| 71 | 60 | 205,000 | 3 | 65 | A | A | 550 | Inv. |
| 72 | 50 | 210,000 | 2 | 55 | A | A | 580 | Inv. |
| 73 | 45 | 220,000 | 2 | 50 | A | A | 600 | Inv. |
| 74 | 55 | 200,000 | 3 | 60 | A | A | 590 | Inv. |
| 75 | 55 | 195,000 | 2 | 60 | A | A | 570 | Inv. |
| 76 | 60 | 198,000 | 3 | 65 | A | A | 580 | Inv. |
| 77 | 55 | 203,000 | 2 | 60 | A | A | 630 | Inv. |
| 78 | 50 | 210,000 | 3 | 55 | A | A | 610 | Inv. |
| 79 | 45 | 212,000 | 3 | 50 | A | A | 520 | Inv. |
| 80 | 50 | 218,000 | 3 | 55 | A | A | 560 | Inv. |
| 81 | 50 | 198,000 | 2 | 55 | A | A | 590 | Inv. |
| 82 | 55 | 196,000 | 3 | 60 | A | A | 610 | Inv. |
| 83 | 55 | 206,000 | 3 | 60 | A | A | 590 | Inv. |
| 84 | 60 | 216,000 | 3 | 65 | A | A | 630 | Inv. |
| 85 | 60 | 217,000 | 2 | 65 | A | A | 620 | Inv. |
| 86 | 40 | 209,000 | 3 | 45 | A | A | 610 | Inv. |
| 87 | 40 | 205,000 | 3 | 45 | A | A | 600 | Inv. |
| 88 | 35 | 212,000 | 2 | 40 | A | A | 600 | Inv. |
| 89 | 45 | 208,000 | 3 | 50 | A | A | 600 | Inv. |
| 90 | 50 | 200,000 | 3 | 55 | A | A | 650 | Inv. |

Inv.: Inventive,

TABLE 11

| Sample No. | Compound of formula 1 or 2 (parts) | Photo-polymerization initiator (parts) | Spectral sensitizing dye (parts) | Monomer (parts) |
|---|---|---|---|---|
| 91 | H-15 (3.0) | I-1 (6.0) | D-5 (4.0) | M-3 (25) NK Ester 4G (15) |
| 92 | H-16 (3.0) | I-1 (6.0) | D-5 (4.0) | M-3 (25) NK Ester 4G (15) |
| 93 | H-40 (3.0) | I-1 (6.0) | D-5 (4.0) | M-3 (25) NK Ester 4G (15) |
| 94 | H-46 (3.0) | I-1 (6.0) | D-5 (4.0) | M-3 (25) NK Ester 4G (15) |
| 95 | H-15 (3.0) | I-1 (6.0) | D-8 (4.0) | M-3 (25) NK Ester 4G (15) |
| 96 | H-16 (3.0) | I-1 (6.0) | D-8 (4.0) | M-3 (25) NK Ester 4G (15) |
| 97 | H-40 (3.0) | I-1 (6.0) | D-8 (4.0) | M-3 (25) NK Ester 4G (15) |
| 98 | H-46 (3.0) | I-1 (6.0) | D-8 (4.0) | M-3 (25) NK Ester 4G (15) |
| 99 | H-15 (3.0) | I-3 (6.0) | D-5 (4.0) | M-3 (25) NK Ester 4G (15) |
| 100 | H-16 (3.0) | I-3 (6.0) | D-5 (4.0) | M-3 (25) NK Ester 4G (15) |
| 101 | H-40 (3.0) | I-3 (6.0) | D-5 (4.0) | M-3 (25) NK Ester 4G (15) |
| 102 | H-46 (3.0) | I-3 (6.0) | D-5 (4.0) | M-3 (25) NK Ester 4G (15) |
| 103 | H-15 (3.0) | I-3 (6.0) | D-8 (4.0) | M-3 (25) NK Ester 4G (15) |
| 104 | H-16 (3.0) | I-3 (6.0) | D-8 (4.0) | M-3 (25) NK Ester 4G (15) |
| 105 | H-40 (3.0) | I-3 (6.0) | D-8 (4.0) | M-3 (25) NK Ester 4G (15) |
| 106 | H-46 (3.0) | I-3 (6.0) | D-8 (4.0) | M-3 (25) NK Ester 4G (15) |

TABLE 12

| Sample No. | Printing durability Sensitivity (μJ/cm²) | (Sheet number) | Small dot reproduction (%) | Storage stability Sensitivity (μJ/cm²) | Stain | Sludge Sludge produced | Amount of sludge (mg) | Remarks |
|---|---|---|---|---|---|---|---|---|
| 91 | 28 | 230,000 | 2 | 35 | A | A | 490 | Inv. |
| 92 | 20 | 300,000 | 2 | 28 | A | A | 485 | Inv. |
| 93 | 32 | 200,000 | 2 | 44 | A | A | 490 | Inv. |
| 94 | 32 | 200,000 | 2 | 44 | A | A | 490 | Inv. |
| 95 | 20 | 300,000 | 2 | 20 | A | A | 525 | Inv. |
| 96 | 15 | 350,000 | 2 | 15 | A | A | 520 | Inv. |
| 97 | 22 | 280,000 | 2 | 22 | A | A | 525 | Inv. |
| 98 | 23 | 280,000 | 2 | 23 | A | A | 525 | Inv. |
| 99 | 30 | 210,000 | 2 | 43 | A | A | 350 | Inv. |
| 100 | 25 | 230,000 | 2 | 30 | A | A | 333 | Inv. |
| 101 | 35 | 190,000 | 2 | 45 | A | A | 370 | Inv. |
| 102 | 35 | 190,000 | 2 | 45 | A | A | 370 | Inv. |
| 103 | 21 | 300,000 | 2 | 19 | A | A | 330 | Inv. |
| 104 | 15 | 350,000 | 2 | 13 | A | A | 300 | Inv. |
| 105 | 25 | 250,000 | 2 | 22 | A | A | 350 | Inv. |
| 106 | 25 | 250,000 | 2 | 23 | A | A | 350 | Inv. |

Inv.: Inventive,

D-5

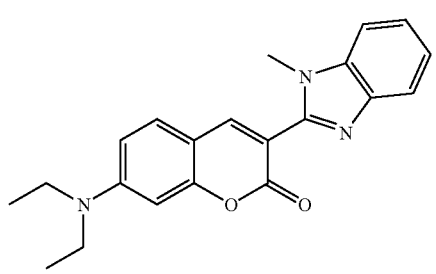

(λ max: 407 nm)

D-6

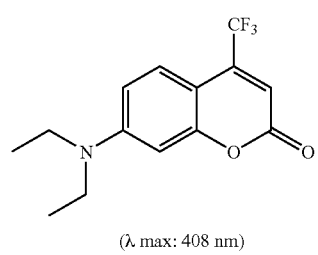

(λ max: 408 nm)

D-7

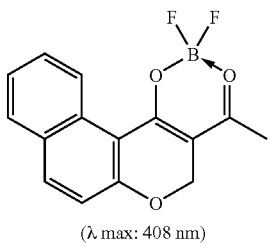

(λ max: 408 nm)

As is apparent from Tables 7 through 12, the inventive sample 46 through 106 provide excellent small dot reproduction, excellent storage stability, reduced sludge as well as high sensitivity and high printing durability.

What is claimed is:

1. A light sensitive composition comprising an addition polymerizable ethylenically unsaturated monomer, a photopolymerization initiator, and a polymer binder, wherein the photopolymerization initiator is comprised of an iron-arene compound and a trihalomethyl group-containing oxadiazole compound represented by the following formula 1,

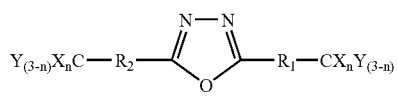

Formula 1 wherein $R_1$ and $R_2$ independently represent a chemical bond, or a divalent group selected from a substituted or unsubstituted alkylene group, a substituted or unsubstituted alkyleneoxy group, an ether group, a carbonyl group, an ester group, a carbonylamino group or a sulfonylamino group, provided that $R_1$ and $R_2$ may be the same or different; X represents a chlorine atom or a bromine atom; Y represents a hydrogen atom or a substituted or unsubstituted alkyl group with a carbon atom number of from 1 to 8; and n is 2 or 3.

2. The light sensitive composition of claim 1, wherein the addition polymerizable ethylenically unsaturated monomer has a tertiary amino group in the molecule.

3. The light sensitive composition of claim 1, wherein the addition polymerizable ethylenically unsaturated monomer is a reaction product of a polyhydric alcohol having a tertiary amino group in the molecule, a diisocyanate compound, and a compound having in the molecule a hydroxyl group and an addition polymerizable ethylenic double bond.

4. The light sensitive composition of claim 1, further comprising a titanocene compound as a photopolymerization initiator.

5. The light sensitive composition of claim 1, further comprising a monoalkyltriaryl-borate compound as a photopolymerization initiator.

6. The light sensitive composition of claim 1, further comprising a dye having an absorption maximum in the wavelength regions of from 350 to 1200 nm.

7. The light sensitive composition of claim 6, wherein the absorption maximum is in the wavelength regions of from 390 to 430 nm.

8. The light sensitive composition of claim 1, further comprising a light-to-heat conversion material.

9. A light sensitive composition comprising an addition polymerizable ethylenically unsaturated monomer, a photopolymerization initiator, and a polymer binder, wherein the photopolymerization initiator is at least one trihalornethyl group-containing oxadiazole compound represented by the following formula 2,

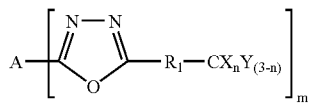

wherein $R_1$ represents a chemical bond, or a divalent group selected from a substituted or unsubstituted alkylene group, a substituted or unsubstituted alkyleneoxy group, an ether group, a carbonyl group, an ester group, a carbonylamino group or a sulfonylamino group; X represents a chlorine atom or a bromine atom; Y represents a hydrogen atom or a substituted or unsubstituted alkyl group with a carbon atom number of from 1 to 8; n is 2 or 3; m is an integer of not less than 2; and A represents an m-valent organic group.

10. The light sensitive composition of claim 9, wherein m is an integer of from 2 to 8, and A represents a polyvalent aliphatic group, a polyvalent aromatic group, —O—, —S—, —NHSO$_2$—, —NHCO—, —NH— or a combination thereof.

11. The light sensitive composition of claim 9, wherein the addition polymerizable ethylenically unsaturated monomer has a tertiary amino group in the molecule.

12. The light sensitive composition of claim 9, wherein the addition polymerizable ethylenically unsaturated monomer is a reaction product of a polyhydric alcohol having a tertiary amino group in the molecule, a diisocyanate compound, and a compound having in the molecule a hydroxyl group and an addition polymerizable ethylenic double bond.

13. The light sensitive composition of claim 9, further comprising a titanocene compound as a photopolymerization initiator.

14. The light sensitive composition of claim 9, further comprising a monoalkyltriarylborate compound as a photopolymerization initiator.

15. The light sensitive composition of claim 9, further comprising an iron-arene compound as a photopolymerization initiator.

16. The light sensitive composition of claim 9, further comprising a dye having an absorption maximum in the wavelength regions of from 350 to 1200 nm.

17. The light sensitive composition position of claim 16, wherein the absorption maximum is in the wavelength regions of from 390 to 430 nm.

18. The light sensitive composition of claim 9, further comprising a light-to-heat conversion material.

19. A light sensitive planographic printing plate material comprising a hydrophilic support, and provided thereon, the light sensitive composition of claim 1.

20. A light sensitive planographic printing plate material comprising a hydrophilic support, and provided thereon, the light sensitive composition of claim 9.

* * * * *